United States Patent

Iwaana et al.

[11] Patent Number: 5,981,984
[45] Date of Patent: Nov. 9, 1999

[54] INSULATED GATE THYRISTOR

[75] Inventors: Tadayoshi Iwaana; Yuichi Harada; Noriyuki Iwamuro, all of Nagano, Japan

[73] Assignee: Fuji Electric Co., Ltd., Japan

[21] Appl. No.: 08/951,863

[22] Filed: Oct. 16, 1997

[30] Foreign Application Priority Data

Oct. 16, 1996 [JP] Japan .................................. 8-272782

[51] Int. Cl.⁶ ........................ H01L 29/745; H01L 29/739
[52] U.S. Cl. ........................ 257/138; 257/139; 257/147; 257/152; 257/156
[58] Field of Search ..................................... 257/138, 139, 257/147, 152, 156

[56] References Cited

U.S. PATENT DOCUMENTS

| | | | |
|---|---|---|---|
| 4,847,671 | 7/1989 | Pattanayak et al. | 357/38 |
| 4,857,983 | 8/1989 | Baliga et al. | 357/38 |
| 4,888,627 | 12/1989 | Pattanayak et al. | 357/23.4 |
| 4,912,541 | 3/1990 | Baliga et al. | 357/38 |
| 5,317,171 | 5/1994 | Shekar et al. | 257/138 |
| 5,319,222 | 6/1994 | Shekar | 257/139 |
| 5,621,226 | 4/1997 | Kobayashi | 257/147 |
| 5,684,306 | 11/1997 | Iwamuro | 257/147 |
| 5,729,032 | 3/1998 | Tomomatsu | 257/139 |

FOREIGN PATENT DOCUMENTS 7335829A 12/1995 Japan .

OTHER PUBLICATIONS

M.S. Shekar et al., High Voltage Current Saturation in Emitter No. 7, Jul. 1991.
N. Iwamuro et al., "A Study of EST's Short Circuit SOA", 5th Int. Symposium on Power Semiconductor Devices & IC's, IEEE 1993, pp. 71–76.
N. Iwamuro et al., Comparison of RBSOA of EST's with IGBTs Semiconductor Devices & IC's, IEEE 1994, pp. 195–199.
B. Jayant Baliga, "The MOS–Gated Emitter Swtiched Thyristor", IEEE Electron Device Letters, vol. 11, No. 2, Feb. 1990.
V.A.K. Temple, "MOS Controlled Thyristors (MCT's)" IEDM, 1984.

*Primary Examiner*—Jerome Jackson, Jr.
*Attorney, Agent, or Firm*—Rossi & Associates

[57] ABSTRACT

An insulated gate thyristor includes a first-conductivity-type base layer having a high resistivity, first and second second-conductivity-type base regions formed in a surface layer of the first-conductivity-type base layer, a first-conductivity-type source region formed in a surface layer of the first second-conductivity-type base region, and a first-conductivity-type emitter region formed in a surface layer of the second second-conductivity-type base region. The thyristor further includes a gate electrode layer formed on an insulating film over the first second-conductivity-type base region, an exposed portion of the first-conductivity-type base layer and the second second-conductivity-type base region, a first main electrode that contacts both the first second-conductivity-type base layer and first-conductivity-type source region, a second-conductivity-type emitter layer formed on the first-conductivity-type base layer, a second main electrode that contacts the second-conductivity-type emitter layer, a gate electrode that contacts the gate electrode layer, and an insulating film covering entire areas of surfaces of the second second-conductivity-type base region and first-conductivity-type emitter region. In this insulated gate thyristor, the first-conductivity-type base layer includes a locally narrowed portion which is interposed between the first and second second-conductivity-type base regions.

24 Claims, 17 Drawing Sheets

INSULATED GATE THYRISTOR

FIELD OF THE INVENTION

The present invention relates in general to an insulated gate thyristor. More specifically, the invention relates to an insulated gate thyristor used as a power switching device.

BACKGROUND OF THE INVENTION

Thyristors have been used as indispensable devices for large capacity power switching owing to the low ON-state voltage characteristic. Gate Turn-Off (GTO) thyristors, for example, are widely used in these days in high-voltage large-current range applications. The GTO thyristor, however, has revealed drawbacks as follows: first, the GTO thyristor requires large gate current for turn-off, in other words, the thyristor has a relatively small turn-off gain; and secondly, a large-sized snubber is needed to safely turn off the GTO thyristor. In addition, since the GTO thyristor does not show current saturation in its current-voltage characteristic, a passive component, such as a fuse, must be coupled to the thyristor so as to protect a load from short-circuiting. This greatly impedes the reduction in the size and cost of the whole system.

MOS controlled thyristor (hereinafter abbreviated as MCT) as a voltage-driven type thyristor was proposed by V. A. K. Temple in IEEE IEDM Tech. Dig., 1984, p 282. Since then, the characteristics of this type of thyristor have been analyzed and improved in various institutions worldwide. This is because the MCT, which is a voltage-driven type device, requires a far simpler gate circuit than the GTO thyristor, while assuring a relatively low ON-state voltage characteristic. The MCT, however, does not show a current saturation characteristic as in the case of the GTO thyristor, and therefore requires a passive component, such as a fuse, in its practical use.

Dr. Pattanayak and others revealed that an emitter switched thyristor (hereinafter abbreviated as EST) shows a current saturation characteristic, as disclosed in U.S. Pat. No. 4,847,671 (Jul. 11, 1989). Subsequently, M. S. Shekar and others proved by actual measurements that a dual channel type emitter switched thyristor (EST-1) shows a current saturation characteristic even in a high voltage range, as disclosed in IEEE Electron Device Letters vol. 12 (1991), p 387. In Proceedings of IEEE ISPSD '93, p 71 and Proceedings of IEEE ISPSD '94, p 195, the inventors of the present invention disclosed results of their analysis on a forward bias safe operation area (FBSOA) and a reverse bias safe operation area (RBSOA) of this EST, and paved the way to the development of a voltage-driven type thyristor having the safe operation area in which the device operates safely when a load is short-circuited. FIG. 25 shows the structure of this EST device.

In the device as shown in FIG. 25, a first p base region 4, p$^+$ well region 5 and a second p base region 6 are formed in a surface layer of an n base layer 3 deposited on a p emitter layer 1 via an n$^+$ buffer layer 2. The p$^+$ well region 5 forms a part of the first p base layer 4, and has a relatively large diffusion depth. An n source region 7 is formed in a surface layer of the first p base region 4, and an n emitter layer 8 is formed in a surface layer of the second p base region 6. A gate electrode 10 is formed on a gate oxide film 9 over a portion of the first p base region 4 that is interposed between the n source region 7 and an exposed portion of the n base layer 3, and a portion of the second p base region 6 that is interposed between the n emitter region 8 and the exposed portion of the n base layer 3. Each of the n source region 7, n emitter region 8 and gate electrode 10 has a limited length in the Z-direction in FIG. 25, and the first p base region 4 and the second p base region 6 are coupled to each other outside these regions 7, 8 and electrode 10. Further, L-shaped p$^+$ well region 5 is formed outside the coupled portion of the first and second p base regions 4, 6. A cathode electrode 11 is formed in contact with both a surface of the p$^+$ well region 5, and a surface of the n source region 7. On the other hand, an anode electrode 12 is formed over the entire area of the rear surface of the p emitter layer 1.

When the cathode electrode 11 of this device is grounded, and positive voltage is applied to the gate electrode 10 while positive voltage is applied to the anode electrode 12, an inversion layer (partial accumulation layer) is formed under the gate oxide film 9, and a lateral MOSFET is thus turned on. As a result, electrons are supplied from the cathode electrode 11 to the n base layer 3, through the n source region 7, and the inversion layer (channel) formed in the surface layer of the first p base region 4. These electrons function as base current for a pnp transistor which consists of the p emitter layer 1, n$^+$ buffer layer 2 and n base layer 3, and the first and second p base regions 4, 6 and p$^+$ well region 5. This pnp transistor operates with this base current. Then, holes are injected from the p emitter layer 1, and flow into the first p base region 4 through the n$^+$ buffer layer 2 and n base layer 3. A part of the holes flow into the second p base region 6, and then flow under the n emitter region 8 in the Z direction to the cathode electrode 11. Thus, the device operates in an IGBT (insulated gate bipolar transistor) mode. With a further increase in the current, the pn junction between the n emitter region 8 and the second p base region 6 is forward biased, and a thyristor portion consisting of the p emitter layer 1, n$^+$ buffer layer 2, n base layer 3, second p base region 6 and n emitter region 8 latches up. In this case, the device operates in a thyristor mode. To turn off the EST, the MOSFET is turned off by lowering the potential of the gate electrode 10 below the threshold of the lateral MOSFET. As a result, the n emitter region 8 is potentially separated from the cathode electrode 11, and the device stops operating in the thyristor mode.

FIGS. 26 and 27 are cross sectional views of improved ESTs as disclosed in U.S. Pat. No. 5,317,171 issued May 31, 1994 and No. 5,319,222 issued Jun. 7, 1994 to M. S. Shekar et al. The improved EST of FIG. 27, in particular, is different from the EST shown in FIG. 25, and is designed so as to provide a further lowered ON-state voltage characteristic.

FIG. 28 is a cross sectional view of a FET controlled thyristor as disclosed in U.S. Pat. No. 4,502,070 issued Feb. 26, 1985 to L. Leipold et al. This thyristor is characterized in that the electrode is not in contact with the second p base region 6.

As is understood from the above description, the EST as shown in FIG. 25 utilizes the holes flowing in the second p base region 6 in the Z direction so as to forward bias the pn junction between the second p base region 6 and the n emitter region 8, and therefore a degree or strength of the forward bias decreases in the Z direction toward a contact area of the second p base region 6 with the cathode electrode 11. Namely, the amount of electrons injected from the n emitter region 8 is not uniform over the length of the pn junction in the Z direction. If this EST is switched from this ON state to the OFF state, a weakly biased portion of the pn junction near the contact area with the cathode electrode 11 initially resumes its reverse-blocking ability, and a deeply biased portion of the pn junction remote from the contact area with the cathode electrode 11 slowly resumes the same ability. This tends to cause current localization or concentration upon turn-off, resulting in lowered capability to withstand breakdown of the EST during turn-off.

Although the EST shown in FIG. 26 operates in a similar manner to the EST of FIG. 25, the EST of FIG. 26 can be turned off more quickly since the cathode electrode 11 extends in the Y direction, to be in direct contact with the surface of the second p base region 6. Further, the EST of FIG. 26 shows a uniform turn-off characteristic due to the absence of the hole current flowing in the Z direction. In the operation of this thyristor, however, minority carriers are not uniformly injected in the horizontal direction (Y direction) when the pn junction between the n emitter region 8 and the second p base region 6 is turned on, and therefore the ON-state voltage cannot be lowered as expected. For example, if the impurity concentration of the second p base region 6 is reduced to increase its resistance so as to solve this problem, a depletion layer is punched through the n emitter region 8 during withstanding of the voltage applied in the forward direction. Thus, the conventional EST cannot achieve a sufficiently high withstand voltage.

In the device shown in FIG. 27, the n emitter region 8 extends beyond the second p base region 6 so as to further lower the ON-state voltage. This structure, however, is unable to withstand the voltage applied in the forward direction.

In the device shown in FIG. 28, the n emitter region 8 and second base region 6 are completely separated from the cathode electrode 11, thus preventing the non-uniform operation of the thyristor. This structure, however, has drawbacks as follows: first, the device shows lowered capability to withstand breakdown since the hole current flows through the device such that it concentrates on the side of the first p base region; and secondly, the conductance in the operation of the transistor in the IGBT mode is reduced due to the contact-type FET effect.

In addition, both the EST and FET controlled thyristor suffer from such problems that the maximum current (limit current) that can flow through the device is large, and the device exhibits low capability to withstand breakdown upon short-circuiting of a load.

SUMMARY OF THE INVENTION

It is therefore an object of the present invention to provide an insulated gate thyristor which is able to uniformly resume the reverse-blocking ability of the pn junction upon turn-off of the thyristor, assuring enhanced capability to withstand turn-off, and which exhibits high capability to withstand breakdown upon short-circuiting of a load, while assuring a sufficiently low ON-state voltage.

To accomplish the above object, there is provided according to the present invention an insulated gate thyristor comprising: a first-conductivity-type base layer having a high resistivity; first and second second-conductivity-type base regions formed in selected areas of a surface layer of a first major surface of the first-conductivity-type base layer; a first second-conductivity-type well region formed under the first second-conductivity-type base region to be connected thereto; a first-conductivity-type source region formed in a selected area of a surface layer of the first second-conductivity-type base region; a first-conductivity-type emitter region formed in a selected area of a surface layer of the second second-conductivity-type base region; a gate electrode layer formed on a gate insulating film over a surface of the first second-conductivity-type base region, an exposed portion of the first-conductivity-type base layer, and a surface of the second second-conductivity-type base region, which surfaces and exposed portion are interposed between the first-conductivity-type source region and the first-conductivity-type emitter region; a first main electrode that contacts both an exposed portion of the first second-conductivity-type base layer and the first-conductivity-type source region; a second-conductivity-type emitter layer formed on a second major surface of the first-conductivity-type base layer; a second main electrode that contacts the second-conductivity-type emitter layer; a gate electrode that contacts the gate electrode layer; and an insulating film covering entire areas of surfaces of the second second-conductivity-type base region and the first-conductivity-type emitter region, wherein the first-conductivity-type base layer includes a locally narrowed portion which is interposed between the first and second second-conductivity-type base regions.

In the insulated gate thyristor constructed as described above, when a voltage is applied to the insulated gate electrode so that an inversion layer appears right under the gate electrode layer, the potential of the first-conductivity-type emitter region becomes equal to that of the first main electrode via a channel of the MOSFET, whereby a thyristor consisting of the first-conductivity-type emitter region, second second-conductivity-type base region, first-conductivity-type base layer and second-conductivity-type emitter layer is turned on. Since the surfaces of the second second-conductivity-type base region and first-conductivity-type emitter region are covered with the insulating film, and electrons are uniformly injected from the entire first-conductivity-type emitter region upon turn-on of the thyristor, the device is rapidly switched to a thyristor mode, and the ON-state voltage is reduced. Thus, the turn-on operation of the present device does not require hole current that flows in the Z-direction through the second second-conductivity-type base region as in the conventional EST. Further, the first-conductivity-type base layer includes a locally narrowed portion between the first and second second-conductivity-type base regions. With the width of the first-conductivity-type base layer thus locally reduced, an effective channel length can be shortened, the contact-type FET effect can be reduced, and the ON-state voltage can be lowered. Upon turn-off, on the other hand, the pn junction can uniformly resume its reverse-blocking ability, causing no current concentration, with a result of improved capability to withstand breakdown.

In one preferred form of the invention, the portion of the gate insulating film located on the second second-conductivity-type base region and the first-conductivity-type base layer has a smaller thickness than the portion of the gate insulating film located on the first second-conductivity-type base region. In this arrangement, the conductivity of the inversion layer appearing in the surface of the second second-conductivity-type base region and that of the accumulation layer appearing in the surface layer of the first-conductivity-type base layer upon application of a voltage to the gate electrode is improved.

In another preferred form of the invention, the width of the exposed portion of the second second-conductivity-type base region that is interposed between the first-conductivity-type base layer and the first-conductivity-type emitter region is smaller than the width of the exposed portion of the first second-conductivity-type base region that is interposed between the first-conductivity-type base layer and the first-conductivity-type source region.

In the above arrangement, the length of the inversion layer appearing in the surface of the second second-conductivity-type base region upon application of a voltage to the gate electrode is reduced, and a series resistance component is therefore reduced, with a result of a lowered ON-state voltage.

Preferably, the second second-conductivity-type base region is formed in a substantially stripe-like shape, or at least one of the first and second second-conductivity-type base regions, the first-conductivity-type emitter region and the first-conductivity-type source region is formed in one of polygonal, circular and elliptical shapes. In such a case, the semiconductor substrate can be utilized with increased efficiency, and the current flowing through the device can be uniformly distributed, assuring improved thermal balance.

In particular, the first second-conductivity-type base region and the first-conductivity-type source region formed in the surface layer thereof are preferably formed so as to surround the second second-conductivity-type base region, or a plurality of the first second-conductivity-type base regions and a plurality of the first-conductivity-type source regions formed in surface layers thereof are preferably formed around the second second-conductivity-type base region. In these arrangements, the current flowing from the first-conductivity-type emitter region to the first-conductivity-type source region through the channel region is widely distributed, thus avoiding current concentration or localization.

In a further preferred form of the invention, each of the first and second second-conductivity-type base regions, the first-conductivity-type emitter region, and the first-conductivity-type source regions has a polygonal shape, and each apex of the second second-conductivity-type base region and the first-conductivity-type emitter region faces one side of the corresponding first second-conductivity-type base region and one side of the corresponding first-conductivity-type source region. In this arrangement, the same effect can be obtained as when the first conductivity-type base layer includes a locally narrowed portion between the first and second second-conductivity-type base regions.

It is also preferable that a plurality of first second-conductivity-type base regions and first-conductivity-type source regions formed in their surface layers are formed around the second second-conductivity-type base region, and the gate electrode layer is formed in a substantially annular shape so as to surround the gate insulating film on the second second-conductivity-type base region, while the first main electrode is disposed on the opposite side of the gate electrode layer, with an insulating film formed therebetween. In this arrangement, an accumulation layer is formed in the surface layer of the first-conductivity-type semiconductor layer underlying the gate electrode, resulting in reduction in the ON-state voltage.

Preferably, a contact portion between the first main electrode and the first second-conductivity-type base region and first-conductivity-type source region has a shape selected from a polygonal shape, a circular shape and an elliptical shape. In this case, the semiconductor substrate can be utilized with improved efficiency, and the current flowing through the device can be uniformly distributed, assuring improved thermal balance.

The diffusion depth of the first-conductivity-type emitter region is preferably greater than that of the first-conductivity-type source region. In this case, the injection of electrons is increased in a thyristor portion, and the current amplification factor of the transistor is increased, with a result of reduction in the ON-state voltage.

The insulated gate thyristor according to the present invention may further include a second second-conductivity-type well region which is formed under the second second-conductivity-type base region to be connected thereto, such that the second second-conductivity-type well region has the same diffusion depth as the first second-conductivity-type well region. In this case, the first and second second-conductivity-type well regions can be formed at a time, and need not be formed separately.

Preferably lifetime killers are present in local portions of the thyristor. In this case, the lifetime distribution of carriers can be optimally controlled, such that no lifetime killers are present in unnecessary portions, thus avoiding an increase in the ON-state voltage and other adverse influences.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

In the process of developing the EST to produce prototypes of various insulated gate thyristors, in an attempt to solve the above-described problems, the inventors of the present invention found that there is no need to contact the first main electrode with the second second-conductivity-type base region, and that even if the surface of the second second-conductivity-type base region is covered with an insulating film, the resulting device can be switched to the thyristor mode, assuring a good trade-off characteristic between the ON-state voltage and the turn-off time. The inventors also made a further analysis on patterns as viewed in the plane of the devices and impurity concentrations.

As a result of the analysis, it was found that the withstand voltage characteristic and ON-state voltage are improved by varying the diffusion depths and impurity concentrations of the first and second second-conductivity-type base regions. It was also found that a good effect or influence on the device arises by each of the following measures: changing the shape of the second second-conductivity type base region, varying the thickness of the gate insulating film on the second second-conductivity-type base region and first conductivity-type base layer, and varying the width of an exposed portion of the second second-conductivity-type base region interposed between the first conductivity-type base layer and the first-conductivity-type emitter region.

The first and second second-conductivity-type base regions may be in the form of stripes that extend in parallel with each other, or may have a polygonal, circular or elliptical shape. If the first second-conductivity-type base region is disposed so as to surround the second second-conductivity-type base region, the current concentration can be reduced or avoided, and thus the device provides an improved trade-off characteristic. A plurality of first second-conductivity-type base regions may be advantageously formed around the second second-conductivity-type base region. It is also advantageous to vary the diffusion thickness of the first-conductivity-type emitter region, and to provide lifetime killers in local areas of the thyristor.

Figure 25:
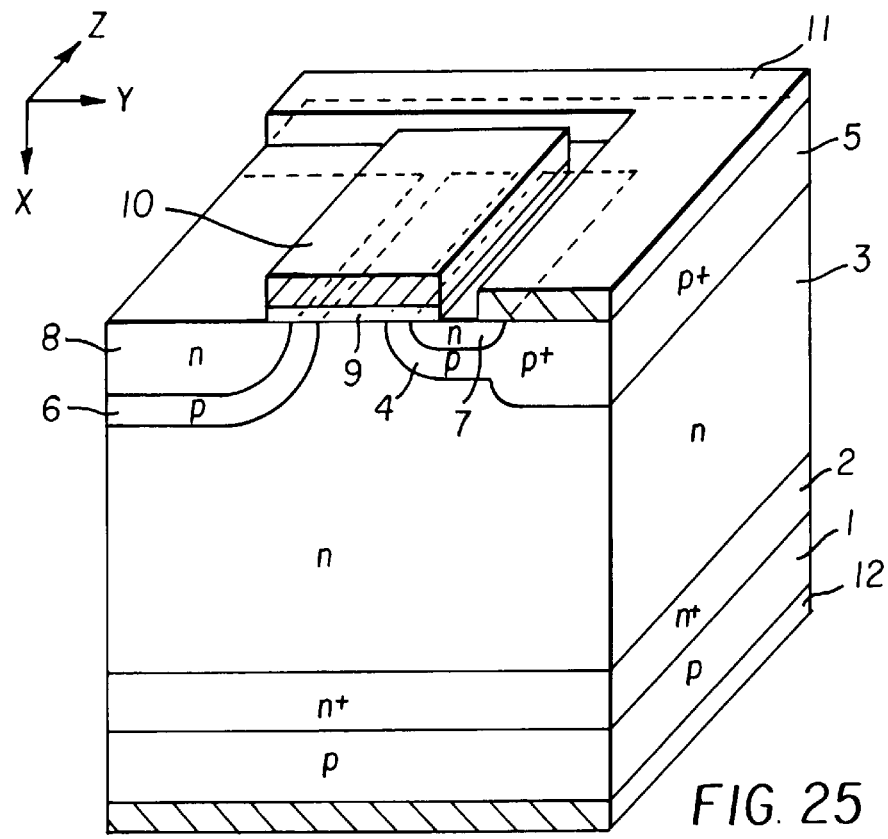
FIG. 25 is a perspective view showing an EST cut in a unit cell.
Figure 28:
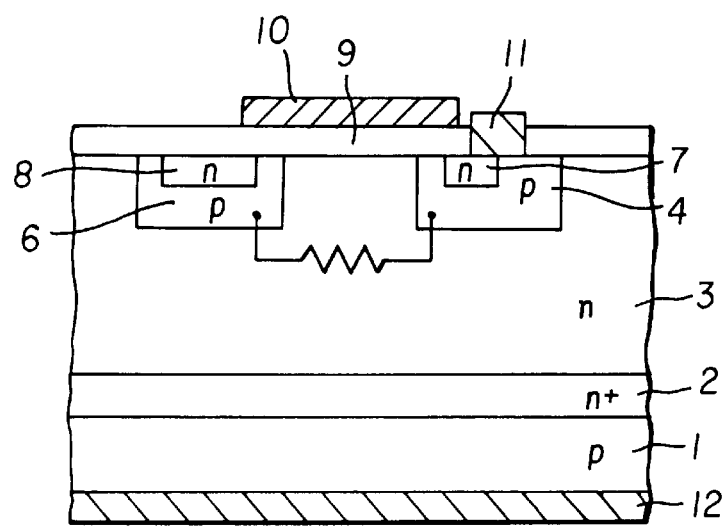
FIG. 28 is a cross sectional view showing a FET controlled thyristor.

Some embodiments of the present invention will be now described, referring to the drawings in which the same reference numerals as used in FIG. 25 are used to identify structurally and/or functionally corresponding elements. In the following description, "n" or "p" prefixed to a region or layer means that the relevant region or layer has electrons or holes, respectively, as majority carriers. While the first conductivity type is n type and the second conductivity type is p type in the following embodiments, the first and second conductivity types may be reversed, namely, may be p type and n type, respectively.

First Embodiment

Figure 1:
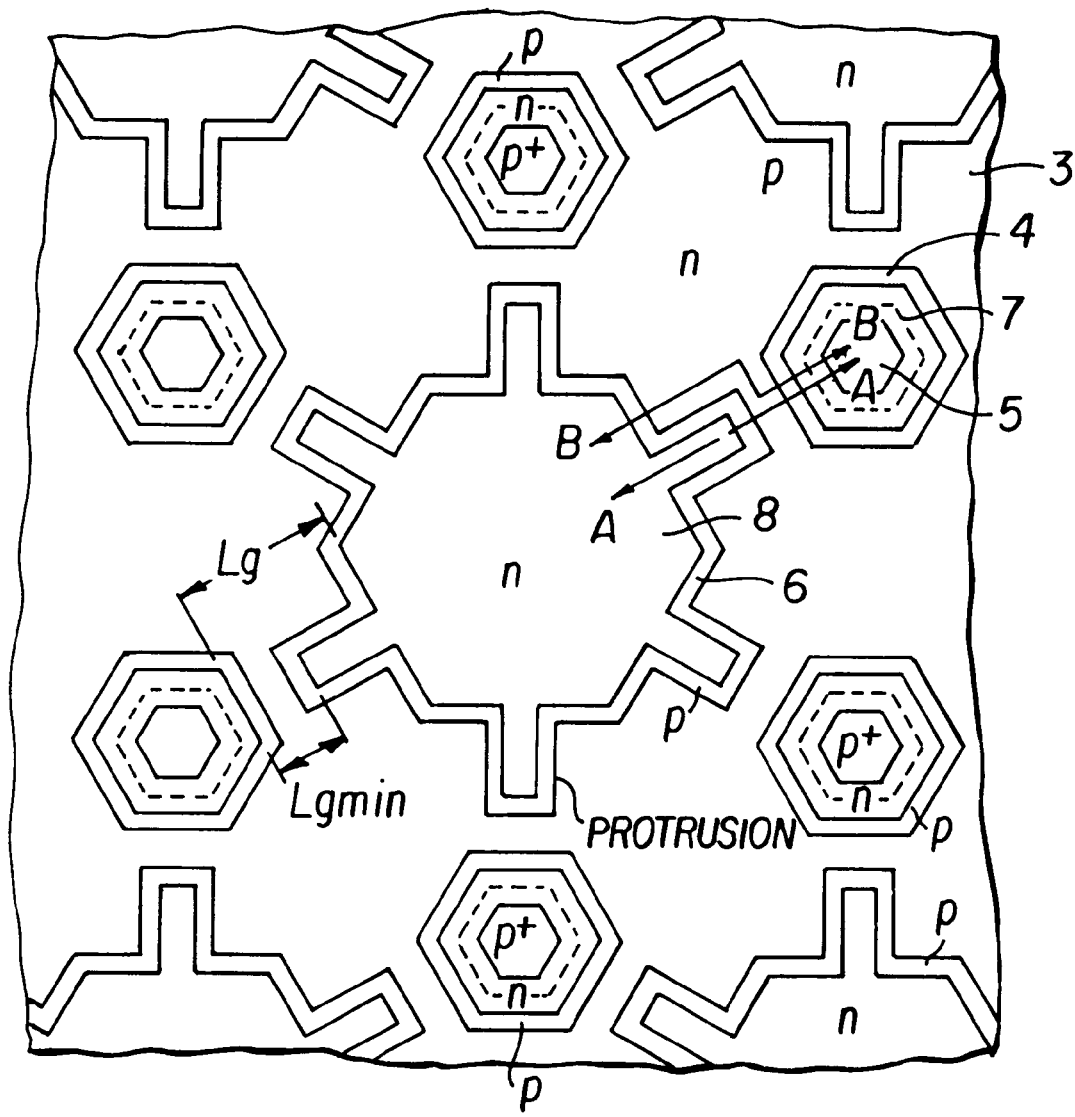
FIG. 1 is a plan view showing the surface of a silicon substrate of an insulated gate thyristor of the first embodiment of the invention.

FIG. 1 is a plan view showing respective diffusion regions formed in the surface of a silicon substrate of an insulated gate thyristor of the first embodiment of the present invention, from which insulating films and electrodes are removed. In FIG. 1, a pattern is formed in which a generally hexagonal second p base region 6 having protrusions is formed in a surface layer of an n base layer 3, and six hexagonal first p base regions 4 are disposed so as to surround the second p base region 6. The insulated gate thyristor of this embodiment is formed by repeating this pattern. A generally annular n source region 7 having hexangular outlines is formed inside each of the first p base regions 4, and a generally hexagonal n emitter region 8 having protrusions is formed inside the second p base region 6. The area defined by a dotted line inside the n source region 7 is a contact region of a cathode electrode 11. In particular, the second p base region 6 and n emitter region 8 are formed with protrusions where the second p base region 6 and the surrounding first p base regions 4 come to be close to each other. Gate electrode (not illustrated in FIG. 1) is provided on a region substantially interposed between the n source regions 7 and n emitter region 8.

Figure 2A:
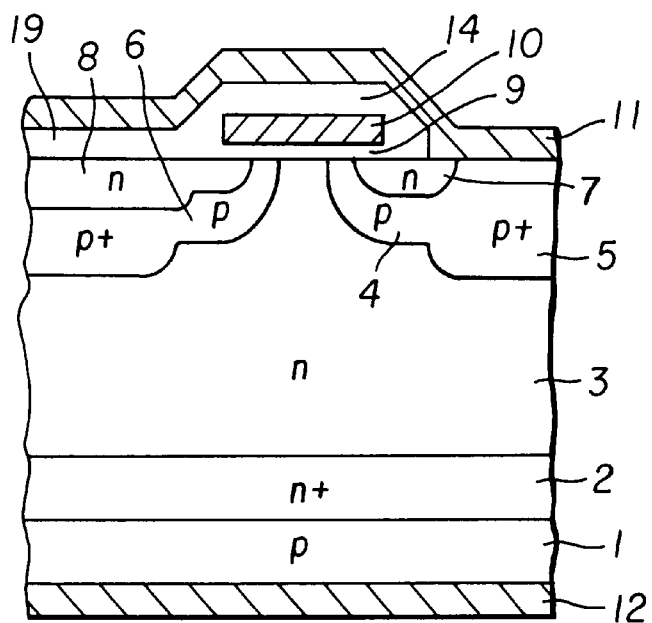
FIG. 2(a) is a cross sectional view taken along line A—A of FIG. 1.
Figure 2B:
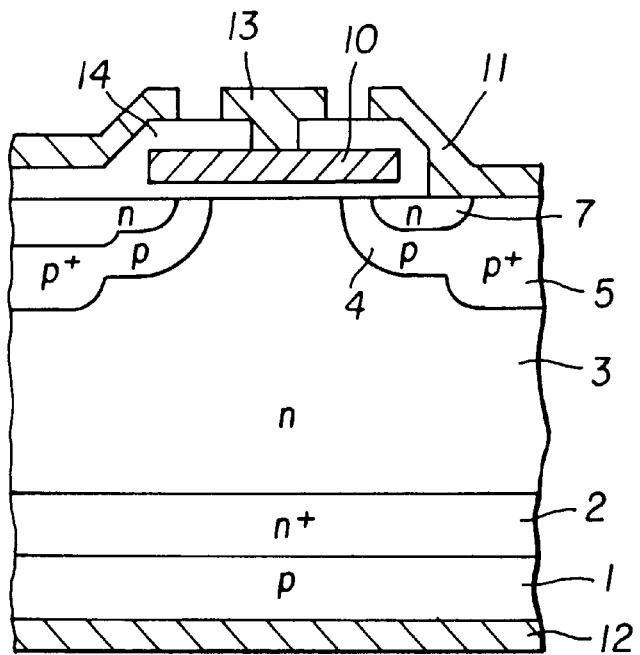
FIG. 2(b) is a cross sectional view taken along line B—B of FIG. 1.

FIG. 2(a) is a cross sectional view taken along line A—A in the plan view of FIG. 1, namely, along one of the protrusions of the second p base region 6, and FIG. 2(b) is a cross sectional view taken along line B—B in FIG. 1, showing a portion of the thyristor that does not include the protrusion of the second p base region 6. The insulated gate thyristor shown in these figures has a semiconductor substrate portion that is structurally similar to that of the EST of FIG. 25. More specifically, the first p base region 4 and the second p base region 6 are formed in a surface layer of one of the opposite surfaces of the n base layer 3 having a high resistivity, such that these base regions 4, 6 are spaced apart from each other. Further, $p^+$ well region 5 having a greater diffusion depth than the first p base region 4 is formed in a part of the first p base region 4 so as to avoid latch up of a parasitic thyristor. A p emitter layer 1 is formed on an $n^+$ buffer layer 2 below the other surface of the n base layer 3. An n source region 7 is formed in a selected portion of a surface layer of the first p base region 4, and an n emitter region 8 is formed in a selected portion of a surface layer of the second p base region 6. As in the thyristor of FIG. 25, a gate electrode layer 10 is formed on a gate oxide film 9 over the surfaces of the first p base region 4, an exposed portion of the n base layer 3 and second p base region 6, which are interposed between the n source region 7 and the n emitter region 8, to thus provide an n-channel lateral MOSFET consisting of the n source region 7, first p base region 4 and n base layer 3. The surface of the MOSFET on the side of the gate electrode 10 is covered with an insulating film 14 made of phosphorus glass (PSG), and a contact hole or aperture is formed through the insulating film 14 so that a cathode electrode 11 contacts both of the surfaces of the first p base region 4 and n source region 7. The surface of the n emitter region 8 is covered with an insulating film 19. An anode electrode 12 is formed in contact with the surface of the p emitter layer 1. Although a gate electrode 13 is formed in contact with the gate electrode layer 10 in the cross sectional view of FIG. 2(b), these electrode and layer 13, 10 are not necessarily in contact with each other as viewed in this cross section. In many cases, the cathode electrode 11 extends over the gate electrode layer 10 via the insulating film 14, as seen in the cross sectional view of FIG. 2(a).

An insulating film 19 lies on a portion of the substrate corresponding to the n emitter region 8 and second p base region 6 of FIG. 1, and the cathode electrode 11 is in contact with a portion corresponding to the n source region 7 and $p^+$ well region 5, which portion is surrounded by the first p base region 4. The n base layer 3 is exposed to the surface of the substrate between the corresponding first p base region 4 and second p base region 6 and between adjacent first p base regions 4. The gate electrode layer 10 is provided above the exposed portions of the first p base region 4, second p base region 6 and n base layer 3.

The insulated gate thyristor of the first embodiment may be produced in substantially the same process in which the conventional IGBT is produced, using different masks for forming respective diffusion regions. To produce a 1200 V-class device, for example, 15 μm-thickness n layer having a resistivity of 0.05 Ω·cm and providing the $n^+$ buffer layer 2, and 115 μm-thickness n layer having a resistivity of 80 Ω·cm and providing the n base layer 3 were epitaxially grown on 450 μm-thickness p type silicon substrate having a resistivity of 0.02 Ω·cm, so as to provide an epitaxial wafer. The $p^+$ well region 5, first p base region 4 and second p base region 6 were formed by implantation of boron ions and thermal diffusion, and the n emitter region 8 and n source region 7 were formed by implantation of arsenic ions and phosphorus ions and thermal diffusion. The edges of the first p base region 4, second p base region 6, n source region 7 and n emitter region 8 were determined by the gate electrode layer 10 formed of polycrystalline silicon and others on the semiconductor substrate, and spacings between these regions 4, 6, 7 and 8 were determined by diffusion of the respective regions in the lateral directions. The cathode electrode 11 and gate electrode 13 were made of an Al alloy and formed by sputtering, and the anode electrode 12 to be soldered to a metallic substrate was formed by laminating three layers of Ti, Ni and Au that by sputtering. The device was irradiated with an electron beam, to control the lifetime of carriers so as to reduce the switching time.

The diffusion depth of the $p^+$ well region 5 was 6 μm, and those of the first and second p base regions 4, 6 were 3 μm. The diffusion depths of the n emitter region 8 and n source region 7 were 1 μm and 0.3 μm, respectively. With the diffusion depth of the respective regions thus controlled, the current amplification factor of the npn transistor of the thyristor portion was increased, and the ON-state voltage was reduced. In regard to the width of the gate electrode 10, an experiment was conducted by setting the distance "Lg" between the first and second p base regions to 15 μm, and varying the spacing "Lgmin" as measured at the protrusion of the second p base region 6 in a range of 3–15 μm. The distance between adjacent first p base regions 4 was about 30 μm, the width of the n source region 7 was 4 μm, and the cell pitch was 55 μm. The portion of the n emitter region 8 close to the first p base region 4 had substantially the same diffusion depth as the n source region 7, with the withstand voltage taken into consideration.

The operation of the insulated gate thyristor constructed as described above will be now described. When the cathode electrode 11 is ground, and a positive voltage that is equal to or greater than a certain value (threshold) is applied to the gate electrode 13 while a positive voltage is applied to the anode electrode 12, an inversion layer (partial accumulation layer) is formed below the gate electrode layer 10, and the lateral MOSFET is turned on. As a result, electrons are initially supplied from the cathode electrode 11 to the n base layer 3, through the n source region 7, and the channel of the MOSFET formed in the surface layer of the first p base region 4. These electrons function as base current for a pnp transistor which consists of the p emitter layer 1, $n^+$ buffer layer 2, n base region 3, and the p base region 4 ($p^+$ well region 5), and holes are injected from the p emitter layer 1, and flow into the first p base region 4, through the $n^+$ buffer layer 2 and the n base layer 3. In this manner, this pnp transistor operates in the IGBT mode. Since the second p base region 6 is in the state of floating in this mode, its potential is gradually increased due to the hole current flowing through the n base layer 3. As is understood from the cross sectional view of FIG. 2, when the transistor is on, the potential of the n emitter region 8 is kept substantially equal to that of the n source region 7 through the channel of the MOSFET, and therefore electrons begin to be injected uniformly from the entire n emitter region 8 into the second p base region 6 after a while. Thus, a thyristor portion consisting of the p emitter layer 1, $n^+$ buffer layer 2, n base layer 3, second p base region 6 and the n emitter region 8 operates in the thyristor mode.

Upon turn-off, the potential of the gate electrode layer 10 is lowered below the threshold of the lateral MOSFET, to turn off the lateral MOSFET, so that the n emitter region 8 is electrically cut off from the cathode electrode 11, and the operation of the thyristor portion is thus stopped.

When the transistor is turned on, the potential of the n emitter region 8 is kept substantially equal to that of the cathode electrode 11, through the channel formed right under the gate electrode layer 10. In the insulated gate thyristor of FIG. 1, the surfaces of both of the second p base region 6 and n emitter region 8 are covered with the insulating film 14, and the second p base region 6 is not in contact with the cathode electrode 11. Therefore, the potential of the second p base region 6 is gradually increased due to the hole current flowing through the n base layer 3, until electrons begin to be injected from the n emitter region 8, whereby the thyristor consisting of the n emitter region 8, second p base region 6, n base layer 3 and p emitter layer 1 is turned on. Thus, the IGBT mode can be rapidly switched to the thyristor mode, without requiring the hole current flowing in the Z direction in the second p base region as in the conventional EST shown in FIG. 25. Further, the ON-state voltage is lowered since the electrons are uniformly injected from the entire n emitter region 8.

Upon turn-off, on the other hand, the pn junction between the n emitter region 8 and the second p base region 6 can uniformly resume its reverse-blocking ability, whereby current localization or concentration can be avoided, assuring a significantly increased reverse bias safe operation area (RBSOA). Further, since a plurality of first p base regions 4 having the n source regions 7 in their surface layers are disposed around the second p base region 6, the device of this embodiment is free from current concentration or localization, and exhibits high capability to withstand breakdown.

Figure 3:
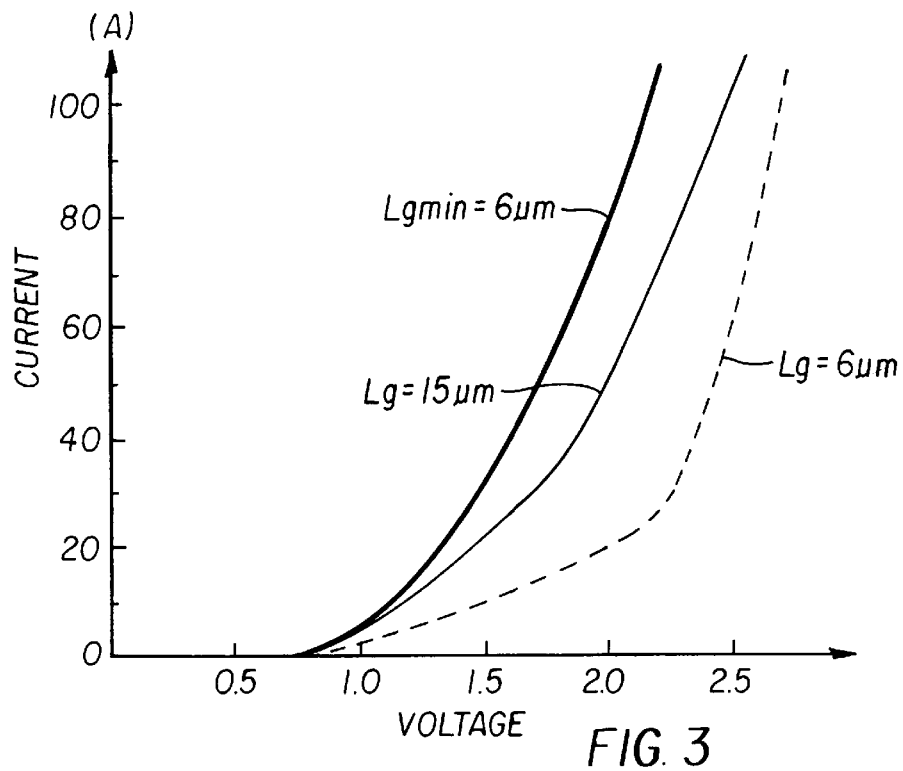
FIG. 3 is a graph showing a current-voltage characteristic of the insulated gate thyristor of the first embodiment.
Figure 4:
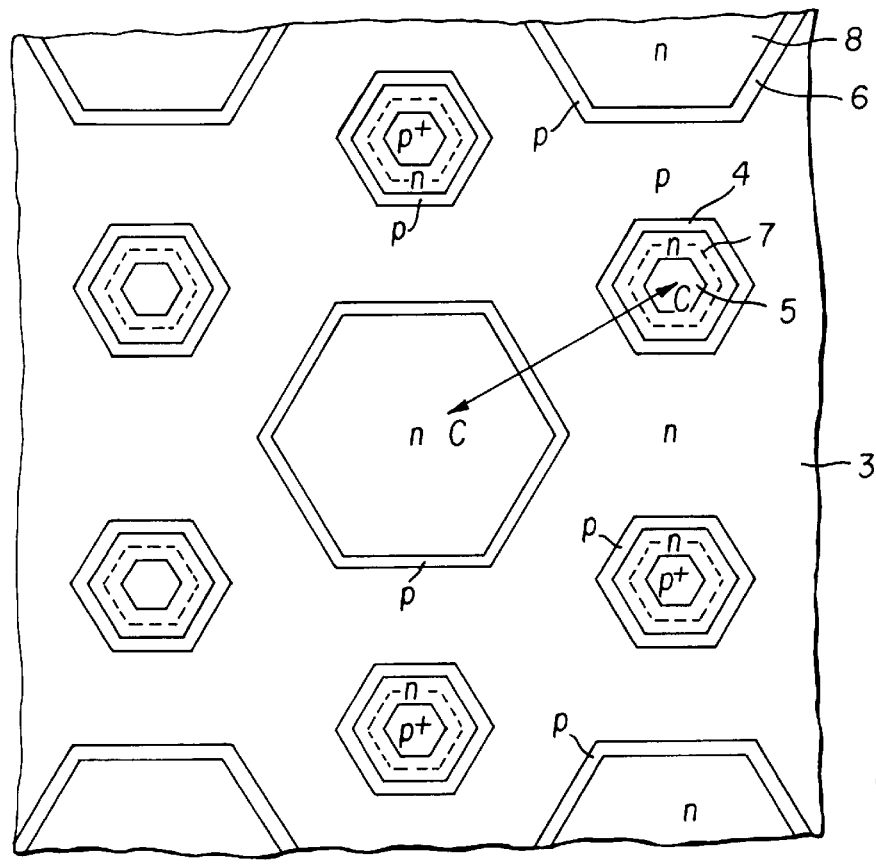
FIG. 4 is a plan view showing a basic pattern of hexagonal arrangement.
Figure 6:
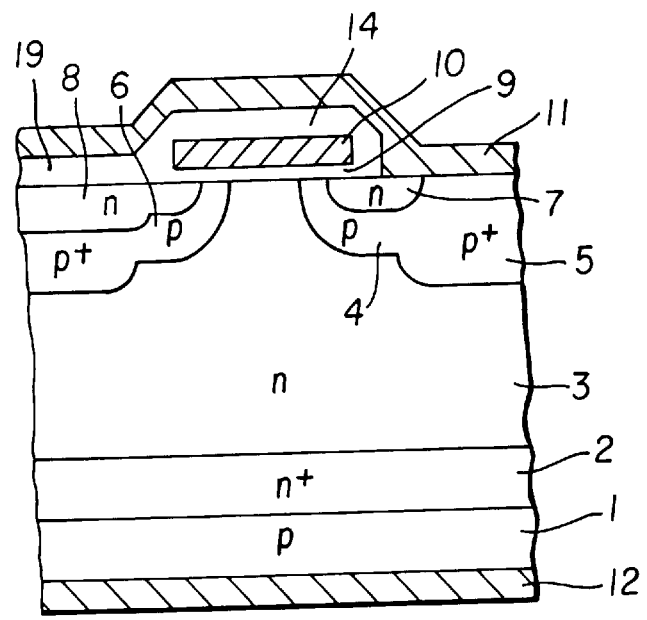
FIG. 6 is a cross sectional view taken along line C—C of FIG. 4.

The graph of FIG. 3 shows a current-voltage characteristic curve when Lg was 15 μm and Lgmin was 6 μm. The axis of abscissas indicates voltage, and the axis of ordinates indicates electric current. This graph also shows current-voltage characteristic curves obtained in two comparative examples with the second p base region 6 and n emitter region 8 having no protrusions, as shown in FIG. 4 that is a plan view of diffusion regions on a silicon substrate. In these comparative examples, Lg is equal to Lgmin. FIG. 6 is a cross sectional view taken along line C—C of FIG. 4. In FIG. 6, the first p base region 4 is spaced a relatively large distance from the second p base region 6, as in FIG. 2(b).

For example, the ON-state voltage at the current density of 50 A/cm$^2$ was 2.0 V when Lg was 15 μm and no protrusions were provided, as indicated by a thin line in FIG. 3, and the ON-state of the device of the present embodiment at the same current density was about 1.75 V, which was 0.25 V lower than that of the comparative example. This is because the channel (hereinafter referred to as accumulation layer) formed in the surface of the n base layer 3 was shortened and its resistance was reduced in the device of the present embodiment in which the second p base regions 6 and n emitter regions 8 are formed with the protrusions. The dotted line in FIG. 3 indicates a characteristic curve of the other comparative example in which no protrusions were provided and the spacing Lg between the first p base region 4 and second p base region 6 was uniformly controlled to 6 μm. The ON-state voltage at 50 A/cm$^2$ in this example was so large as 2.40 V. This is because the contact-type FET effect was intensified contrary to the above-described first embodiment, and therefore the supply of electrons from the n source region 7 to the n base layer 3 was limited, resulting in reduced injection of holes. Consequently, the thyristor was turned ON more slowly, and the ON-state voltage was increased.

Figure 7:
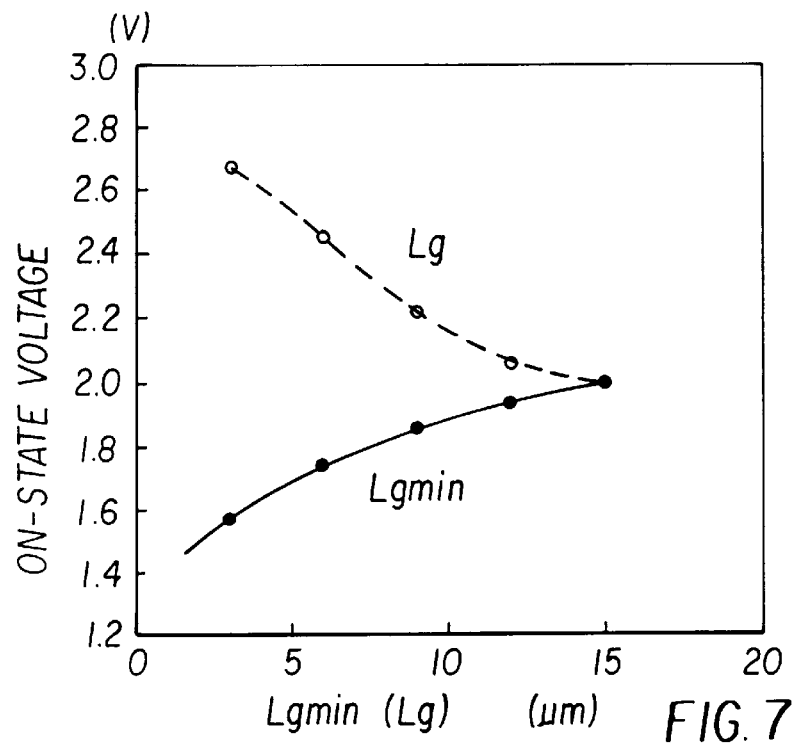
FIG. 7 is a graph showing the dependence of the ON-state voltage on Lgmin in the insulated gate thyristor of the first embodiment.

FIG. 7 is a graph showing the dependence of the ON-state voltage on Lgmin when the current density was 50 A/cm$^2$. The axis of abscissas indicates Lgmin measured at the protrusions, and the axis of ordinates indicates the ON-state voltage. The lifetime was controlled so as to provide a constant turn-off loss. As shown in FIG. 7, the ON-state voltage was reduced with a decrease in Lgmin, and was reduced down to 1.57 V when the Lgmin was 3 μm. This is because the supply of electrons from the n source region 7 was not largely restricted due to the contact-type FET effect as described above, and the resistance of the accumulation layer was reduced. The saturation current measured when Lgmin was in the range of 6–15 μm was constantly 200 A/cm$^2$, and did not vary in this range. This is because the saturation current was determined by the volume of the gate oxide film and the impurity concentration at the surface of the first p base region 4 right under the gate oxide film. However, the current was not saturated in the insulated gate thyristor in which Lgmin was 3 μm. This is because the first and second p base regions 4, 6 were connected or linked to each other in this case, and thus electrons were kept being supplied from the n source region 7 to the n emitter region 8 regardless of the potential of the anode.

In FIG. 7, the dotted line indicates the dependence of the ON-state voltage on Lg when the Lg was varied. In this case, the ON-state voltage was increased with a decrease in Lg, because of the contact-type FET effect as described above. The rate of reduction of the ON-state voltage was reduced as Lg was increased, since the resistance of the accumulation layer was increased, and the area of the thyristor was reduced.

It will be understood from the graph of FIG. 7 that the insulated gate thyristor having a sufficiently low ON-state voltage can be provided by reducing Lgmin while keeping Lg at a certain large value, rather than simply reducing Lg.

Figure 8:
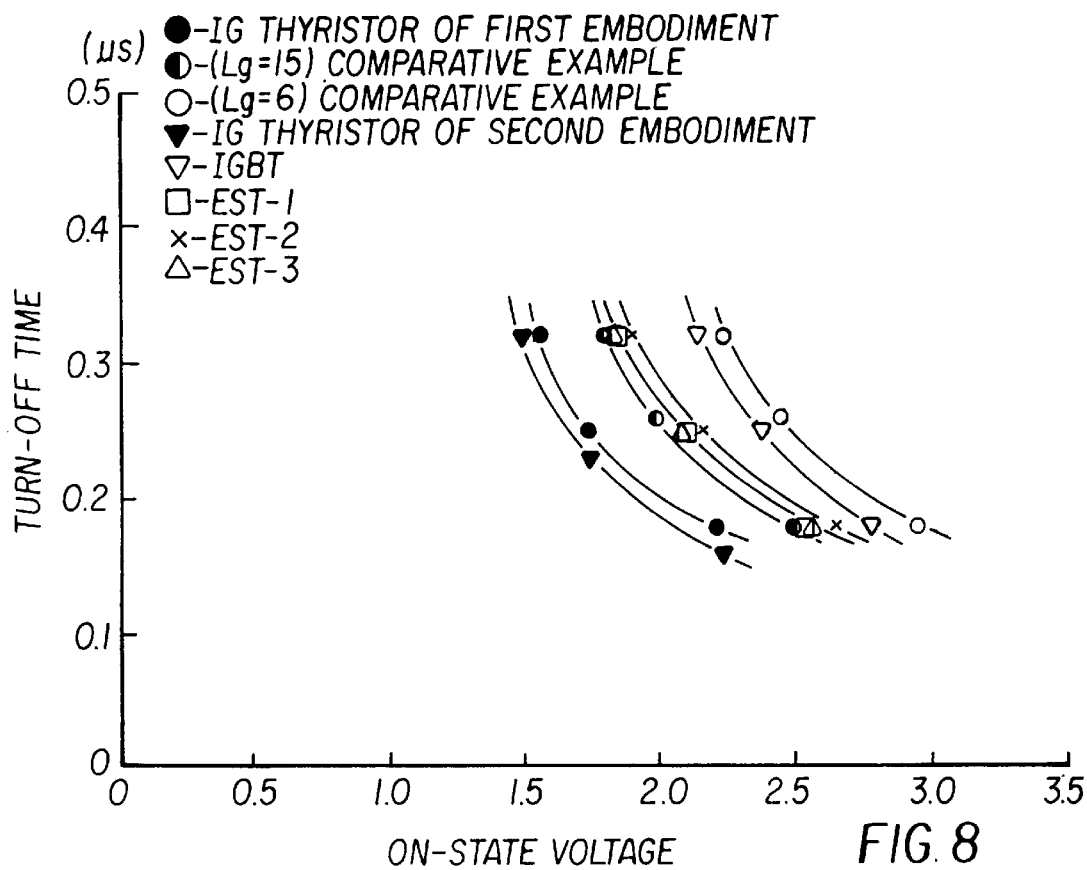
FIG. 8 is a graph showing a trade-off characteristic between the ON-state voltage and the turn-off time of 1200 V-class devices of the first embodiment and comparative examples.
Figure 26:
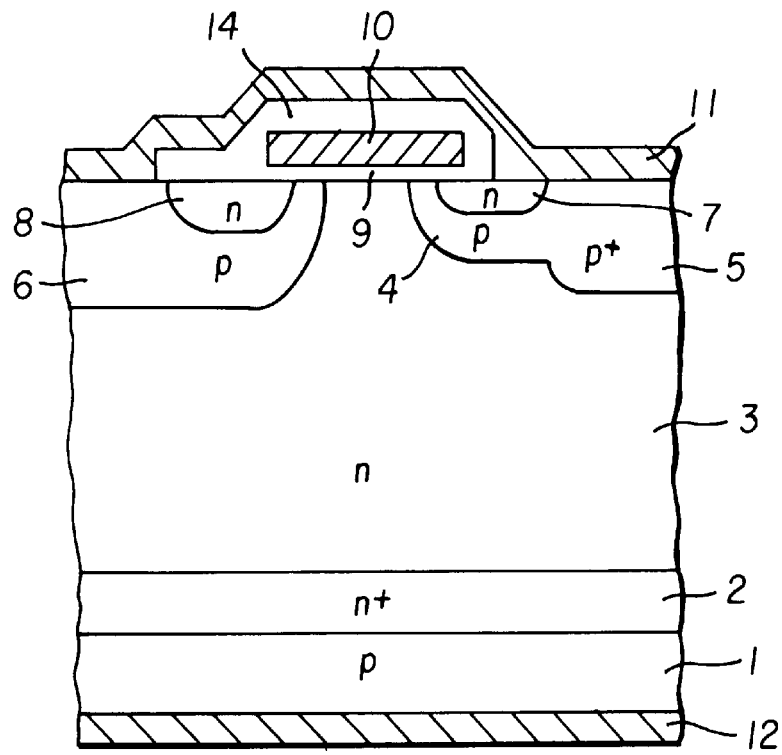
FIG. 26 is a cross sectional view showing an improved EST.
Figure 27:
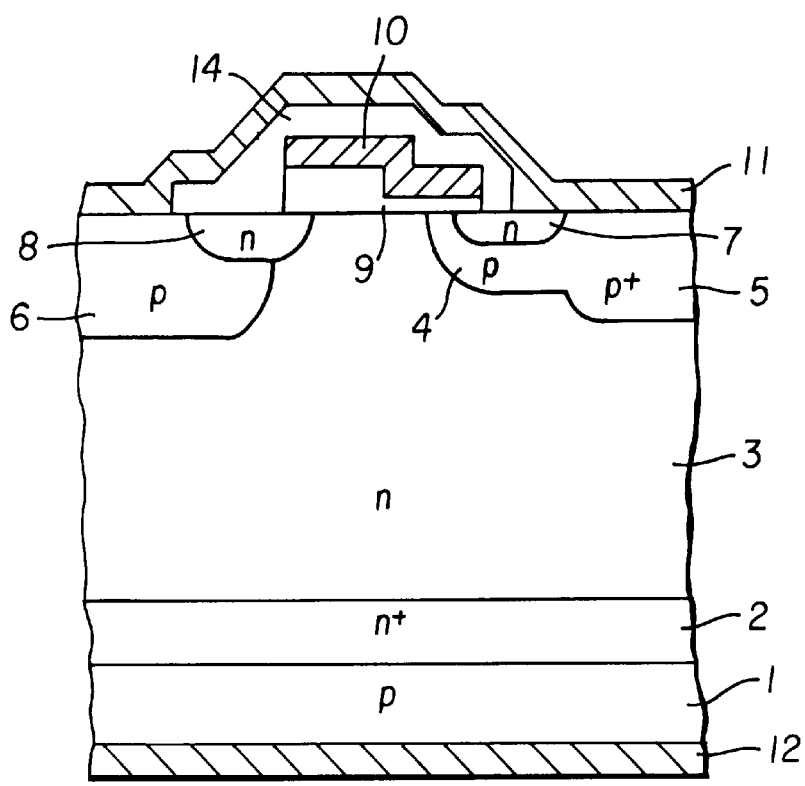
FIG. 27 is a cross sectional view showing another improved EST.

The graph of FIG. 8 shows a trade-off characteristic between the ON-state voltage and the turn-off time of the insulated gate thyristor when the lifetime of carriers was varied. The axis of abscissa indicates the ON-state voltage measured at the current density of 50 A/cm$^2$, and the axis of ordinates indicates the turn-off time. For comparison, FIG. 8 also shows trade-off characteristics of the above-explained comparative examples with the second p base regions having no protrusions, EST (that will be represented as EST-1) shown in FIG. 25, EST (that will be represented as EST-2) shown in FIG. 26, EST (that will be represented as EST-3) shown in FIG. 27, and IGBT. In both of EST-2 and EST-3, the width of the n emitter region 8 was controlled to 20 μm.

It is understood from FIG. 8 that the insulated gate thyristor of the first embodiment exhibited a far better trade-off characteristic than the above comparative examples. Of the comparative example having no protrusions of the second p base regions, the example in which Lg was equal to 15 μm exhibited a similar characteristic to EST-3, and the example in which Lg was equal to 6 μm exhibited a worse characteristic than IGBT for the reason as described above.

Second Embodiment

In the second embodiment, lifetime control was conducted by implanting helium ions, instead of irradiating the device with the electron beam as in the first embodiment. The irradiation with helium ions was carried out under conditions of an accelerating voltage of 24 MeV and a dose amount of $1\times10^{11}$–$1\times10^{12}$ cm$^{-2}$. After the irradiation, the device was annealed at 350–375° C.

The graph of FIG. 8 also shows a trade-off characteristic between the ON-state voltage and the turn-off time of the insulated gate thyristor of this second embodiment.

The irradiation with helium ions is a method for producing crystal defects that provide lifetime killers in local portions of the device. Since optimum distribution of the lifetime killers can be achieved by this method, and the lifetime killers do not appear in unnecessary portions, the insulated gate thyristor of the present embodiment shows an even better trade-off characteristic than that of the first embodiment.

Another specimen of insulated gate thyristor was produced in which the lifetime control was conducted by irradiation with protons. The dose amount was substantially equal to that of the helium ions as used in the second embodiment. The thus produced device exhibited substantially the same characteristics as the second embodiment in which the lifetime control was conducted by irradiation with helium ions.

Third Embodiment

Figure 9:
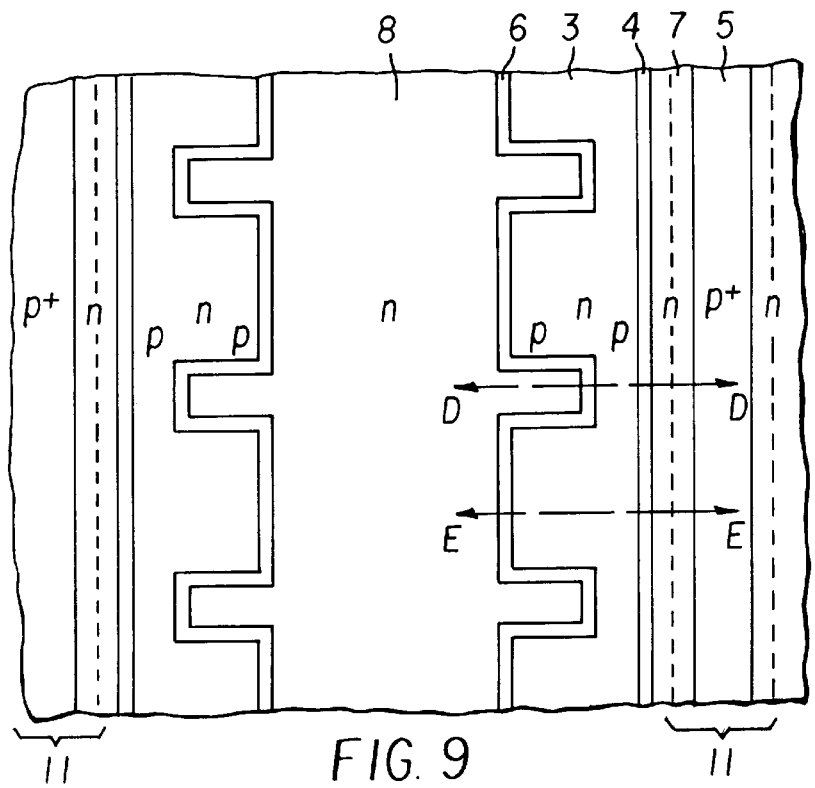
FIG. 9 is a plan view showing the surface of a silicon substrate of an insulated gate thyristor of the third embodiment.

FIG. 9 is a plan view showing respective diffusion regions formed in the surface of a silicon substrate of an insulated gate thyristor of the third embodiment of the present invention, from which insulating films and electrodes are removed. In FIG. 9, a pattern is formed in which a stripe-shaped second p base region 6 having protrusions is formed in a surface layer of an n base layer 3, and stripe-shaped first p base regions 4 are disposed so as to face the longitudinal sides of the second p base region 6. This pattern is repeated to provide the insulated gate thyristor of the present embodiment. A stripe-shaped n emitter region 8 having protrusions is formed inside each of the second p base regions 6, and a stripe-shaped n source region 7 is formed inside each of the first p base regions 4. The area defined by dotted lines in the n source regions 7 is a contact region of a cathode electrode 11.

The cross section taken along line D—D of FIG. 9 is identical with that of FIG. 2(a), and the cross section taken along line E—E is identical with that of FIG. 2(b).

The insulated gate thyristor of the third embodiment is different from those of the first and second embodiments only in its pattern as viewed in the plane, and has substantially the same operating characteristics and others as the previous embodiments.

Figure 10:
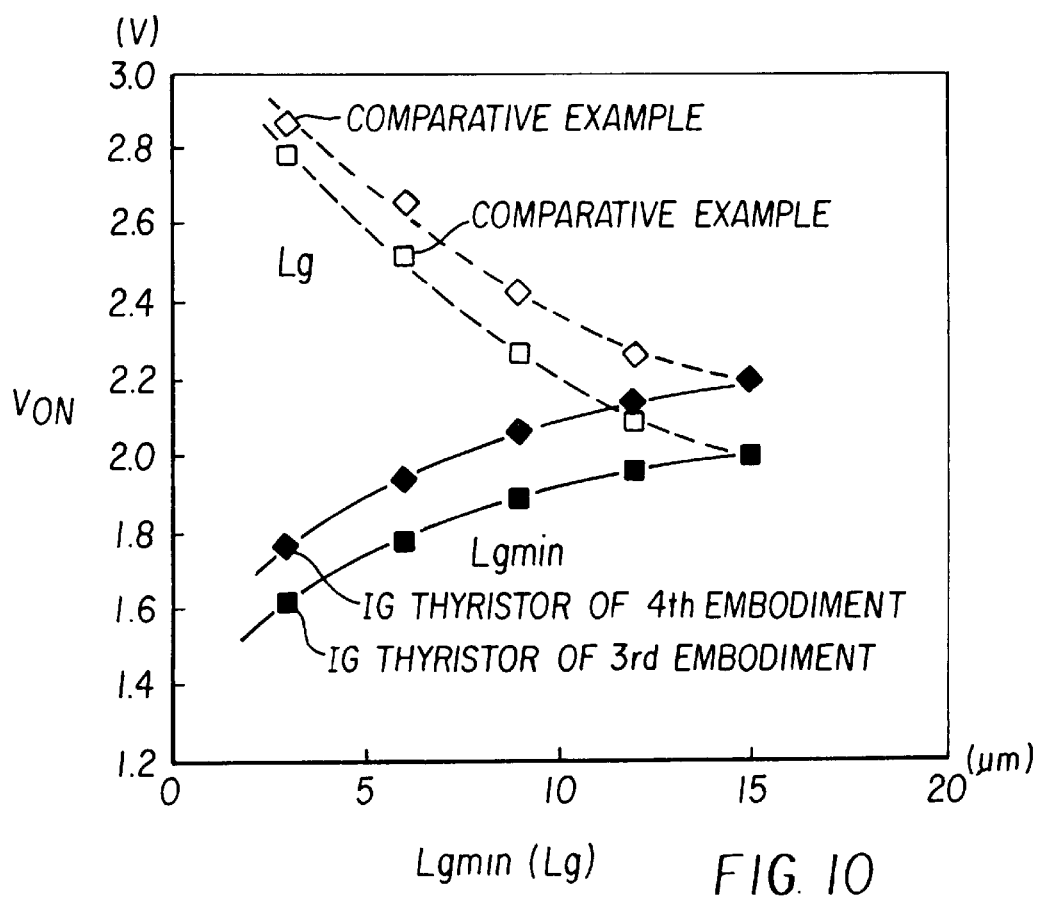
FIG. 10 is a graph showing the dependence of the ON-state voltage on Lgmin in the insulated gate thyristors of the third and fourth embodiments.

With regard to the width of the gate electrode layer 10, an experiment was conducted by setting the spacing Lg between the first and second p base regions to 15 μm, and varying the spacing Lgmin measured at the protrusion(s) of the second p base region 6 in a range of 3–15 μm. The graph of FIG. 10 shows the dependence of the ON-state voltage on Lgmin when the current density was 50 A/cm$^2$. The axis of abscissas indicates Lgmin measured at the protrusion, and the axis of ordinates indicates the ON-state voltage. The lifetime of carriers was controlled so as to provide a constant turn-off loss. As shown in FIG. 10, the ON-state voltage was reduced with a decrease in Lgmin, and reduced down to 1.62 V when Lgmin was 3 μm. This is because the supply of electrons from the n source region 7 was not largely restricted due to the contact-type FET effect as described above, and the resistance of the accumulation layer was reduced. The saturation current measured when Lgmin was in the range of 6–15 μm was constantly 300 A/cm$^2$, and did not vary in this range. This is because the saturation current was determined by the volume of the gate oxide film and the impurity concentration at the surface of the first p base region 4 right under the gate oxide film. However, the current was not saturated in the insulated gate thyristor in which Lgmin was 3 μm. This is because the first and second p base regions 4, 6 were connected or linked with each other in this case, and thus electrons were kept being supplied from the n source region 7 to the n emitter region 8, as described above with respect to the first embodiment.

Figure 5:
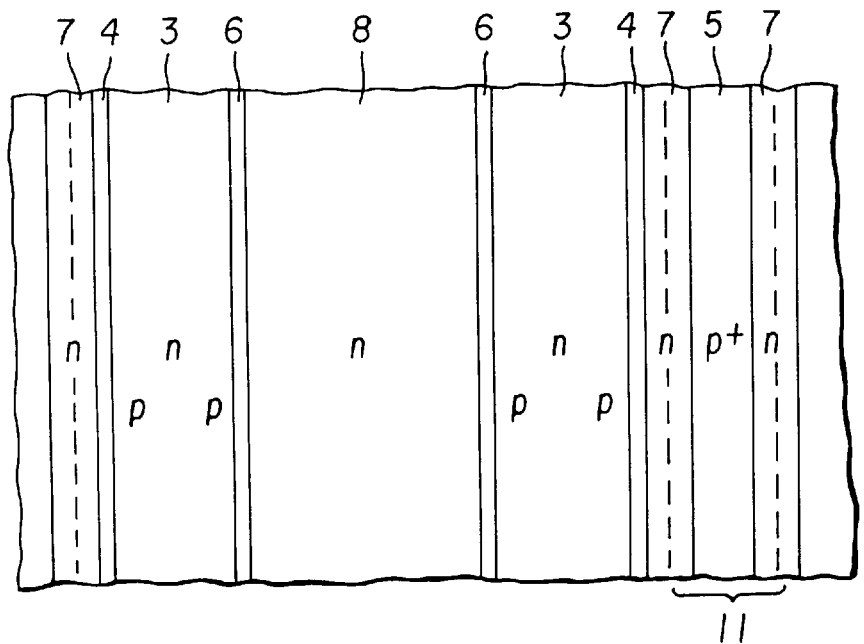
FIG. 5 is a plan view showing a basic pattern of striped arrangement.

The graph of FIG. 10 also indicates the dependence of the ON-state voltage on varying Lg in a comparative example in which the second p base regions 6 and n emitter regions 8 had no protrusions in the planar pattern of the diffusion regions on the silicon substrate as shown in FIG. 5. In this case, the ON-state voltage was increased with a decrease in Lg, because of the contact-type FET effect as described above. The rate of reduction of the ON-state voltage was reduced as Lg was increased, since the resistance of the accumulation layer was increased, and the area of the thyristor was reduced.

It will be understood from the graph of FIG. 10 that the insulated gate thyristor having a sufficiently low ON-state voltage can be provided by reducing Lgmin while keeping Lg at a certain large value, rather than simply reducing Lg.

Figure 11:
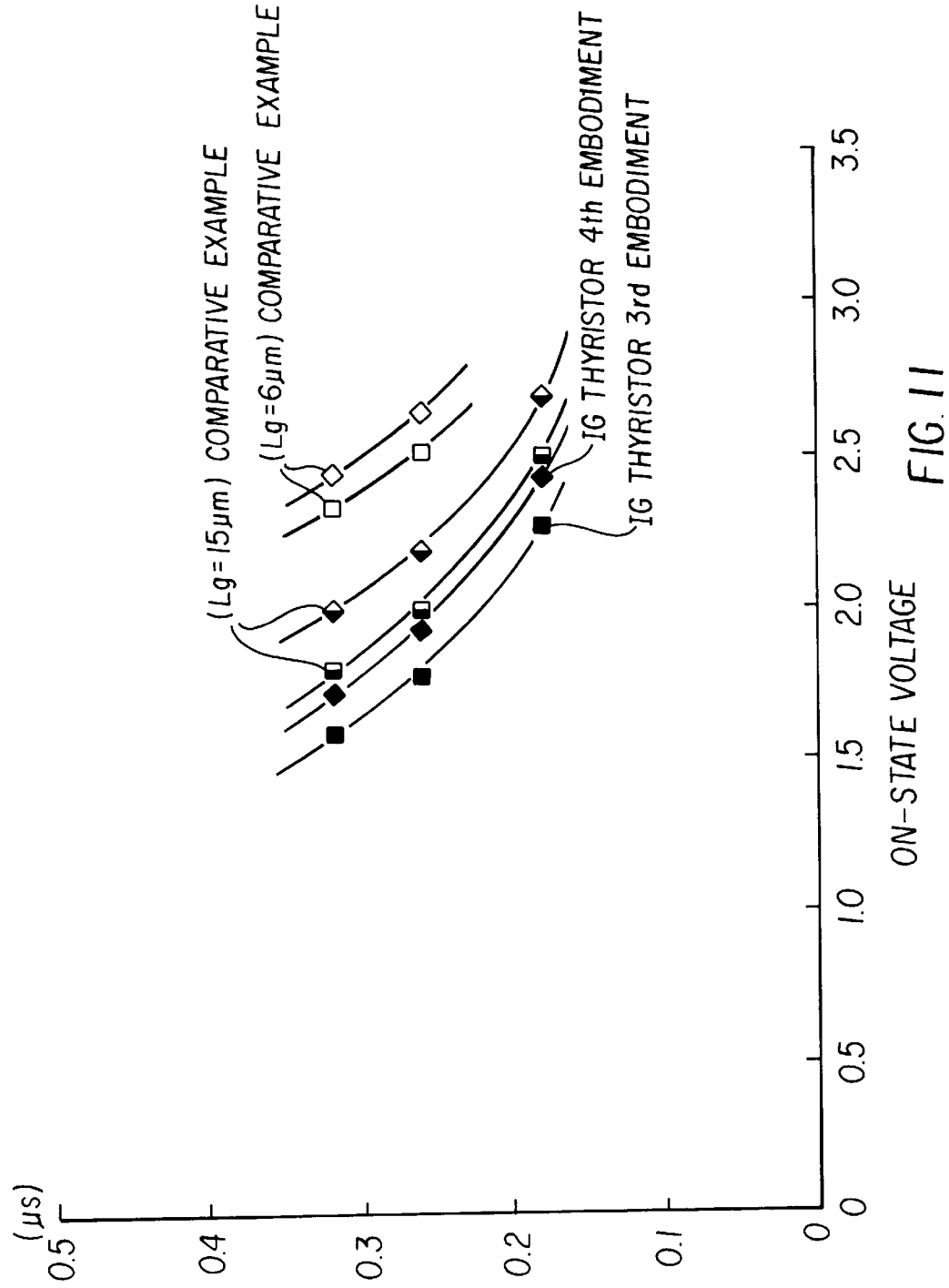
FIG. 11 is a graph showing trade-off characteristics between the ON-state voltage and the turn-off time in the insulated gate thyristors of the third and fourth embodiments of the invention.

The graph of FIG. 11 shows a trade-off characteristics between the ON-state voltage and the turn-off time of the insulated gate thyristor of the third embodiment when the lifetime of carriers was varied by irradiation with an electron beam. The axis of abscissas indicates the ON-state voltage measured at the current density of 50 A/cm$^2$, and the axis of ordinates indicates the turn-off time. For comparison, the trade-off characteristics of the comparative examples having no protrusions of the second p base regions as explained above are also shown in FIG. 11.

It will be understood that the insulated gate thyristor of the third embodiment has a far better trade-off characteristic than the comparative example (Lg=15 μm) having no protrusions of the second p base regions. The comparative example in which Lg was equal to 6 μm exhibited an even worse characteristic, for the reason as described above.

Fourth Embodiment

Figure 12A:
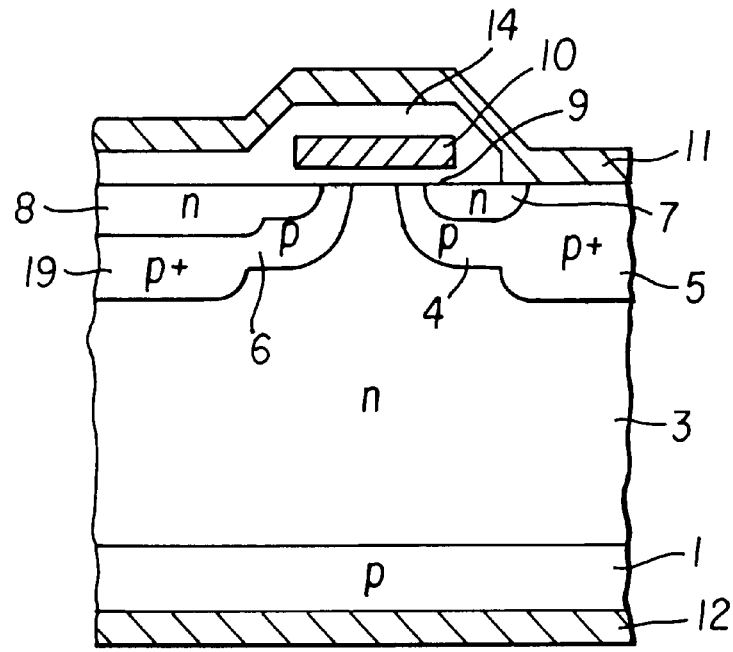
FIGS. 12(a) and 12(b) are cross sectional view corresponding to those of FIGS. 2(a), 2(b), showing parts of the insulated gate thyristor of the fourth embodiment.
Figure 12B:
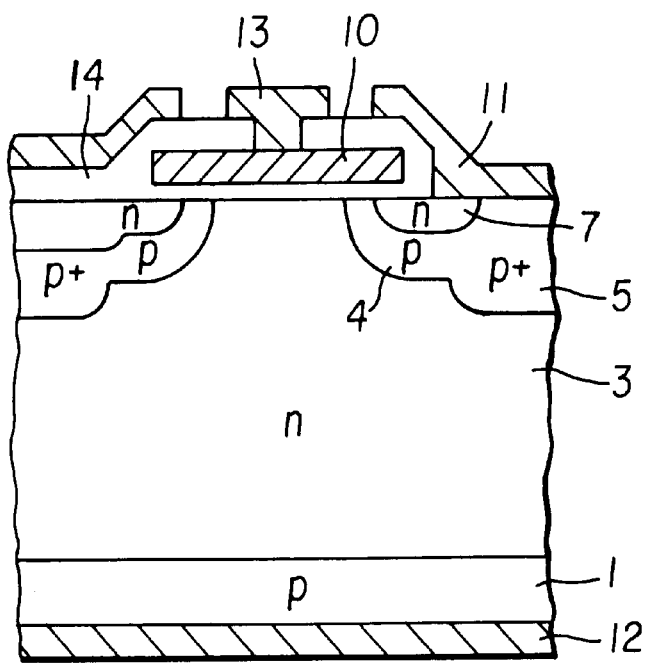

While the n$^+$ buffer layer 2 is provided between the p emitter layer 1 and the n base layer 3 in each of the devices of the above-described embodiments, the present invention is also applicable to a similar device having no n$^+$ buffer layer 2. FIG. 12(*a*) and 12(*b*) are cross sectional views showing a part of an insulated gate thyristor according to the fourth embodiment of the present invention, which is fabricated using a bulk silicon wafer, rather than an epitaxial wafer. Although the structure on one of opposite main surfaces of the n base layer 3 formed of the bulk silicon wafer is the same as that of the second embodiment of FIG. 3, the p emitter layer 1 is directly formed on the other main surface of the n base layer 3. The p emitter layer 1 is formed by implantation of boron ions and thermal diffusion. One example of the present embodiment used a silicon wafer having a resistivity of 60 Ω·cm and a thickness of 200 μm.

With regard to the width of the gate electrode layer 10, an experiment was conducted by setting the spacing Lg between the first and second p base regions to 15 μm, and varying the spacing Lgmin measured at the protrusion of the second p base region 6 in a range of 3–15 μm. The graph of FIG. 10 shows the dependence of the ON-state voltage on Lgmin when the current density was 50 A/cm$^2$. The lifetime of carriers was controlled so as to provide a constant turn-off loss.

In the fourth embodiment, too, the ON-state voltage was lowered with a decrease in Lgmin, and reduced down to 1.77 V when Lgmin was 3 μm. The saturation current measured when Lgmin was in the range of 6–15 μm was constantly 200 A/cm$^2$, and did not vary in this range. However, the current was not saturated in the insulated gate thyristor in which Lgmin was 3μm. The reasons of these results are the same as those as stated in the first embodiment.

The graph of FIG. 10 also indicates the dependence of the ON-state voltage on varying Lg in a comparative example in which the second p base regions 6 and n emitter regions 8 had no protrusions in the planar pattern of the diffusion regions on the silicon substrate as shown in FIG. 5. In this case, the ON-state voltage was increased with a decrease in Lg. The saturation current measured when Lgmin was in the range of 6–15 μm was constantly 200 A/cm$^2$, and did not vary in this range, while the current was not saturated when Lgmin was 3 μm.

It will be understood from the graph of FIG. 10 that the insulated gate thyristor having a sufficiently low ON-state voltage can be provided by reducing Lgmin while keeping Lg at a certain large value, rather than simply reducing Lg.

The graph of FIG. 11 shows a trade-off characteristics between the ON-state voltage and the turn-off time of the insulated gate thyristor of the fourth embodiment when the lifetime of carriers was varied by irradiation with an electron beam. The axis of abscissas indicates the ON-state voltage measured at the current density of 50 A/cm$^2$, and the axis of ordinates indicates the turn-off time. For comparison, the trade-off characteristics of the comparative examples having no protrusions of the second p base regions as explained above are also shown in FIG. 11.

It will be understood from FIG. 11 that the insulated gate thyristor of the fourth embodiment has a far better trade-off characteristic than the comparative example (Lg=15 μm) having no protrusions of the second p base regions. The comparative example in which Lg was equal to 6 μm exhibited an even worse characteristic, for the reason as described above.

Although the insulated gate thyristor using a bulk silicon wafer generally has a little larger ON-state voltage and an inferior trade-off characteristic compared to the thyristor using an epitaxial wafer, the use of the bulk silicon wafer eliminates a need to accomplish epitaxial growth and is thus still advantageous in terms of the cost and reduced crystal defects. Due to these advantages, the insulated gate thyristor using a bulk silicon wafer may be preferred depending upon the application and specification of the device.

Fifth Embodiment

To produce a 600 V-class insulated gate thyristor in the same manner in which the insulated gate thyristor of the first embodiment was produced, 10 μm-thickness n layer having a resistivity of 0.1 Ω·cm and providing the n⁺ buffer layer 2, and 55 μm-thickness n layer having a resistivity of 40 Ω·cm and providing the n base layer 3 were epitaxially grown on 450 μm-thickness p type silicon substrate having a resistivity of 0.02 Ω·cm, so as to provide an epitaxial wafer. The insulated gate thyristor produced in this manner was used as an example of the device of the fifth embodiment.

The insulate gate thyristor of the present embodiment also had the same diffusion depths of the respective regions as that of the first embodiment. Namely, the diffusion depth of the p⁺ well region 5 was 6 μm, and those of the first and second p base regions 4, 6 were 3μm. The diffusion depths of the n emitter region 8 and n source region 7 were 1 μm and 0.3 μm, respectively.

With regard to the width of the gate electrode 10, an experiment was conducted by setting the distance "Lg" between the first and second p base regions to 15 μm, and varying the spacing "Lgmin" as measured at the protrusion of the second p base region 6 in a range of 3–15 μm.

Figure 13:
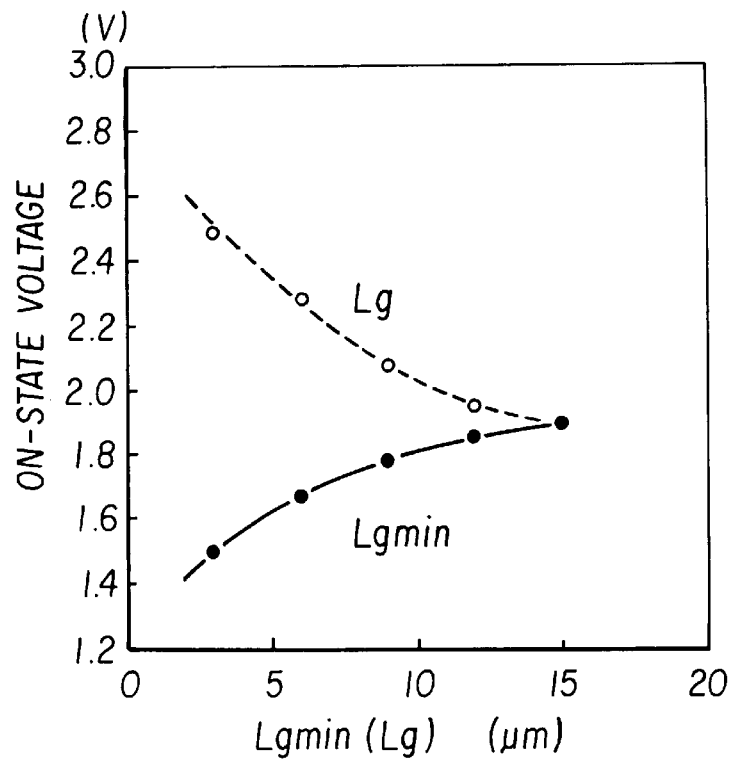
FIG. 13 is a graph showing the dependence of the ON-state voltage on Lgmin in an insulated gate thyristor of the fifth embodiment.

The graph of FIG. 13 shows the dependence of the ON-state voltage on Lgmin when the current density was 100 A/cm². The lifetime of carriers was controlled so as to provide a constant turn-off loss.

In the fifth embodiment, too, the ON-state voltage was reduced with a decrease in Lgmin, and reduced down to 1.50 V when Lgmin was 3 μm. The saturation current measured when Lgmin was in the range of 6–15 μm was constantly 400 A/cm², and did not vary in this range. However, the current was not saturated in the insulated gate thyristor in which Lgmin was 3 μm. The reasons of these results are the same as those as stated in the first embodiment.

The graph of FIG. 13 also indicates the dependence of the ON-state voltage on varying Lg in a comparative example in which the second p base regions 6 and n emitter regions 8 had no protrusions in the planar pattern of the diffusion regions on the silicon substrate as shown in FIG. 5. In this case, the ON-state voltage was increased as Lg was reduced. The saturation current measured when Lgmin was in the range of 6–15 μm was constantly 400 A/cm², and did not vary in this range, while the current was not saturated when Lgmin was 3 μm.

It will be understood from the graph of FIG. 13 that the insulated gate thyristor having a sufficiently low ON-state voltage can be provided by reducing Lgmin while keeping Lg at a certain large value, rather than simply reducing Lg.

Sixth Embodiment

Figure 15:
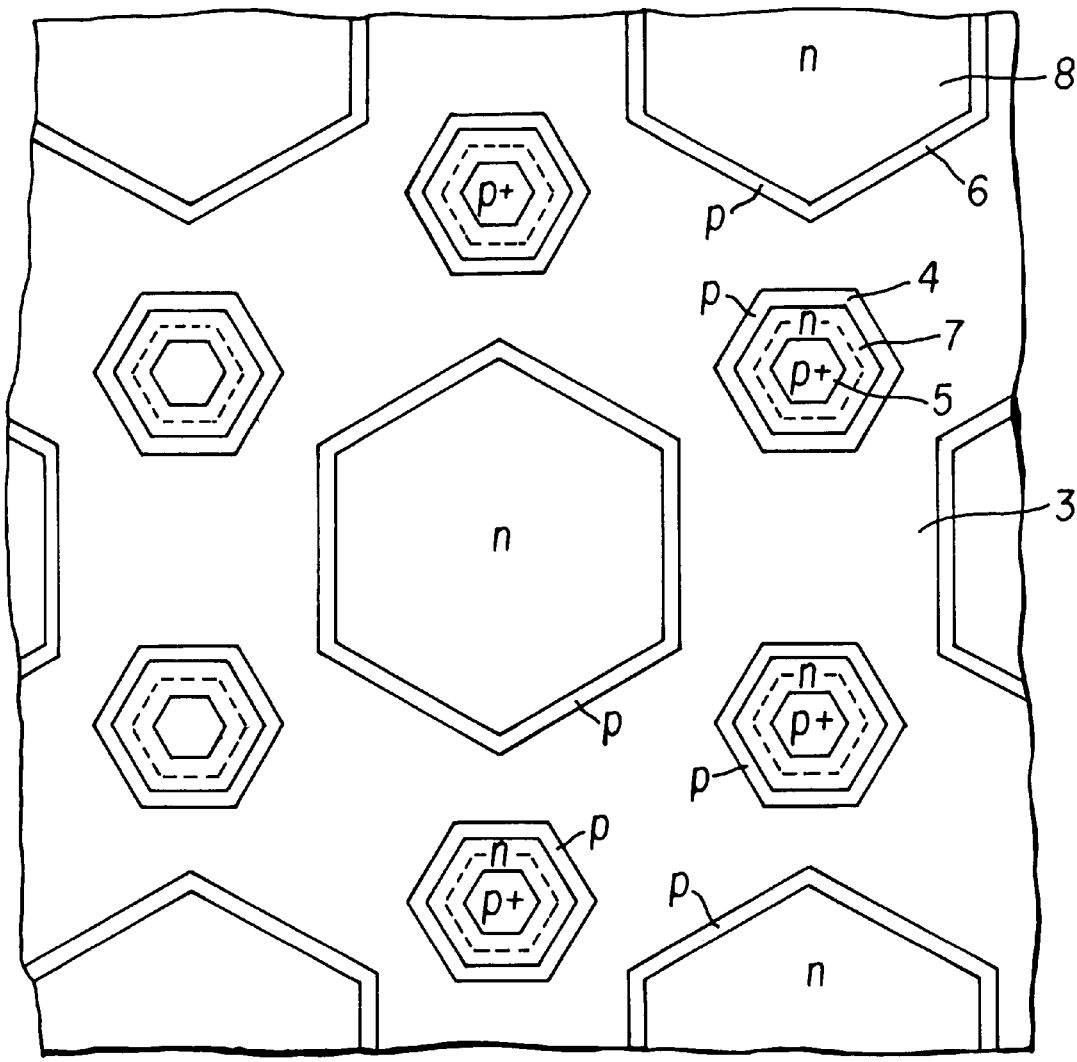
FIG. 15 is a plan view showing the surface of a silicon substrate of an insulated gate thyristor of the sixth embodiment.

FIG. 15 is a plan view showing respective diffusion regions formed in the surface of a silicon substrate of an insulated gate thyristor of the sixth embodiment of the present invention, from which insulating films and electrodes are removed. Although the insulated gate thyristor of the present embodiment is similar to that of the first embodiment in that hexagonal first p base regions 4 are positioned in a hexagonal pattern in the surface layer of the n base layer 3, the thyristor of this embodiment is different from that of the first embodiment in that the second p base region 6 located at the center of the hexagonal pattern of the first p base regions 4 has a hexagonal shape having no protrusions, and that the apexes of the hexagonal second p base region 6 face the sides of the respective first p base regions 4. A generally annular n source region 7 having hexangular outlines is formed inside each of the first p base regions 4, and a hexagonal n emitter region 8 is formed within the second p base region 6. The area defined by a dotted line in the n source region 7 is a contact region of a cathode electrode 11.

The process for producing the insulated gate thyristor of the sixth embodiment and its operation are substantially the same as those of the insulated gate thyristor of the first embodiment, and therefore will not be explained.

In the present embodiment, the spacing between the first p base region 4 and the second p base region 6, or the width of the gate electrode layer 10, can be locally reduced or narrowed without forming the second p base region 6 with protrusions. Thus, the area that experiences the contact-type FET effect is geometrically reduced, and the resistance of the accumulation layer is reduced, to provide an insulated gate thyristor having a low ON-state voltage and a good trade-off characteristic between the ON-state voltage and the turn-off time.

Figure 16:
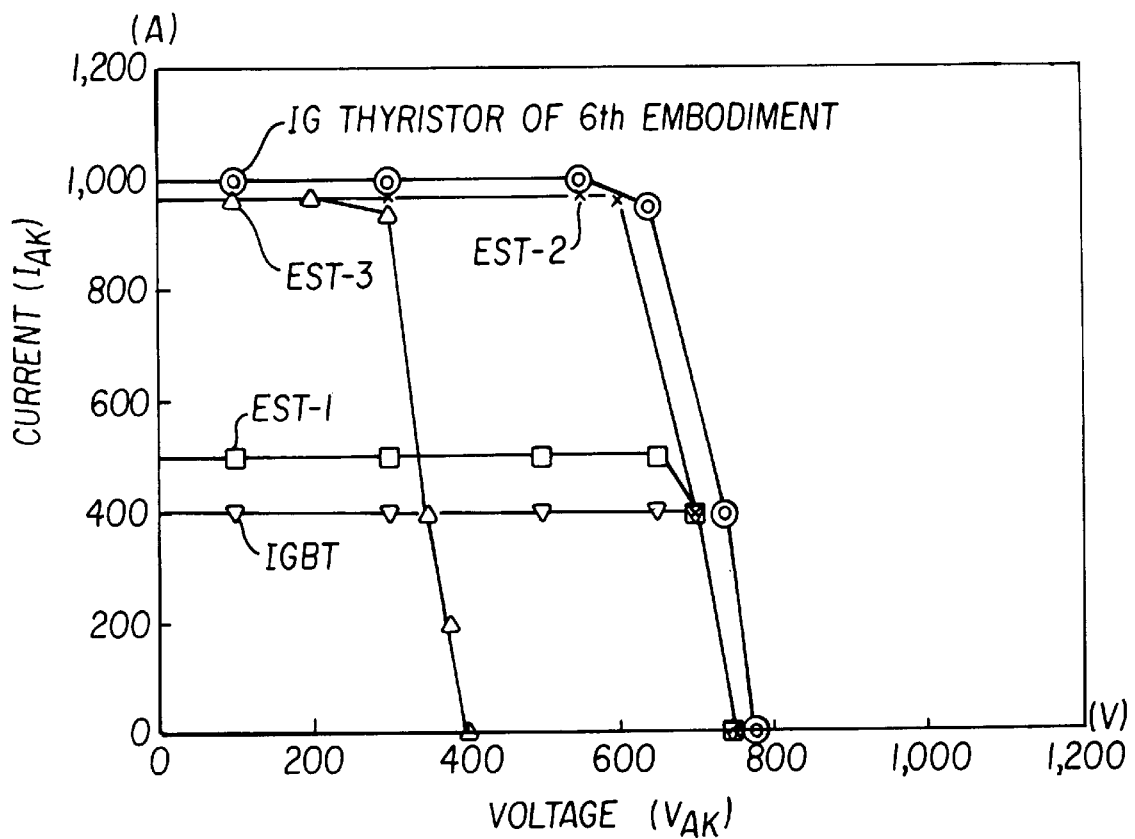
FIG. 16 is a graph showing the RBSOA of 600 V-class devices of the sixth embodiment and comparative examples.
Figure 17:
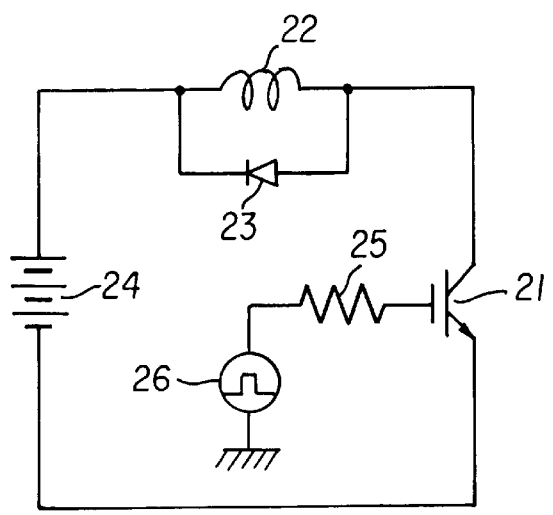
FIG. 17 is a view showing a circuit diagram for measuring the RBSOA.

The graph of FIG. 16 shows results of measurements of the reverse bias safe operation areas (RBSOA) of the insulated gate thyristor of the sixth embodiment as shown in FIG. 15, EST-1, EST-2, EST-3 and IGBT as comparative examples. The RBSOA was measured at 125° C. with a measuring circuit as shown in FIG. 17. In the graph of FIG. 16, the axis of abscissa indicates voltage ($V_{AK}$) between the anode and the cathode, and the axis of ordinates indicates electric current ($I_{AK}$).

In FIG. 17, a device 21 to be measured was connected to a dc power supply 24, through a 1 mH inductor 22 and a free-wheeling diode 23 that were coupled in parallel with each other, and a gate of the device 21 was connected to a gate power supply 26, through a resistor 25 of 20 Ω.

The device shown in FIG. 16 was produced as a 600 V-class device, and the devices of the comparative examples were produced using epitaxial wafers having the same specification as that of the insulated gate thyristor of the fifth embodiment as described above. The n emitter region 8 of both of EST-2 and EST-3 had a width of 20 μm. All of these five devices had a chip size of 1 cm². The ON-state voltage, as defined by a fall of the potential occurring upon conduction of 100 A current, was as low as 0.82 V for the insulated gate thyristor of the sixth embodiment, 1.6 V for the EST-1, 1.7 V for the EST-2, 1.0 V for the EST-3, and 2.3 V for the IGBT.

It will be understood from FIG. 16 that the device of the sixth embodiment of the invention has a lower ON-state voltage than the other devices, and has a safe operation area that is three times as large as that of the IGBT, and twice as large as those of the EST-1 and EST-3, which means that the present device exhibits high capability to withstand breakdown. While the present device exhibits substantially the same capability to withstand breakdown as the EST-2, it is still advantageous over the EST-2 because of the lower ON-state voltage. Thus, the ON-state voltage can be lowered without affecting other characteristics. This is because the current concentration does not occur in the arrangement in which the n emitter region 8 and second p base region 6 are formed in polygonal shape, and these regions 8, 6 are surrounded by a plurality of first p base regions 4.

To provide the structure as shown in FIG. 15, various patterns of the first and second p base regions other than those of the first embodiment of FIG. 1 and the third embodiment of FIG. 9 may be employed. For example, the first and second p base regions may have a rectangular shape or a circular shape, or the first p base regions may be located around the second p base region in a different manner.

Seventh Embodiment

Figure 18:
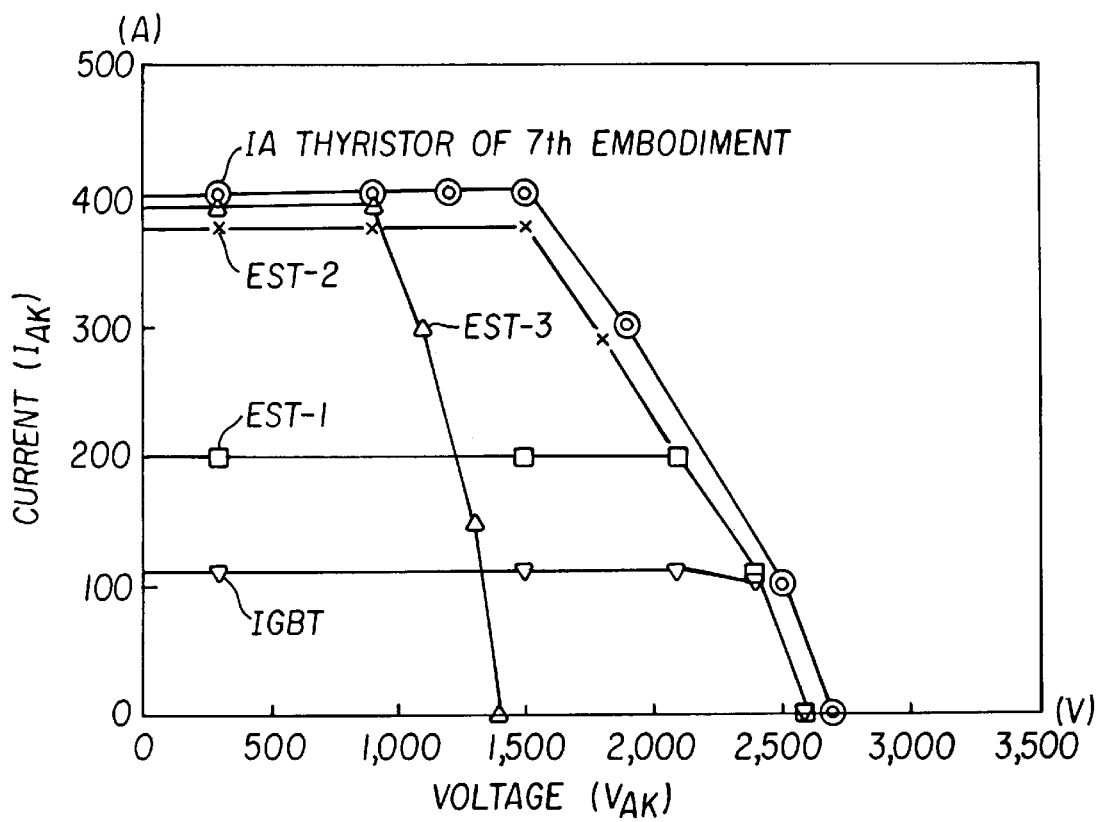
FIG. 18 is a graph showing the RBSOA of 2500 V-class devices of the seventh embodiment and comparative examples.

The graph of FIG. 18 shows the reverse bias safe operation areas (RBSOA) measured at 125° C. with respect to 2500 V-class devices including an insulated gate thyristor of the seventh embodiment having the structure of FIG. 12 and the pattern of FIG. 15, and EST-1, EST-2, EST-3 and IGBT as comparative examples. In the graph of FIG. 18, the axis of abscissa indicates voltage ($V_{AK}$) between the anode and the cathode, and the axis of ordinates indicates electric current ($I_{AK}$). In this case, the thickness of the n base layer 3 was 440 $\mu$m. The other dimensions and others were substantially equal to those of the insulated gate thyristor of the first embodiment. The ON-state voltages of these five types of devices, when measured at the current density of 50 A/cm$^2$, were 1.01 V for the insulated gate thyristor of the present embodiment, 2.0 V for the EST-1, 2.2 V for the EST-2, 1.4 V for the EST-3, and 3.3 V for the IGBT. As in the case of the 600 V-class devices using epitaxial wafers as described above, the results of measurements as shown in FIG. 18 with respect to the 2500 V-class devices using bulk wafers indicate that the insulated gate thyristor of the present embodiment of the invention has a significantly large RBSOA and also has a low ON-state voltage as compared with those of the ESTs and IGBT. This is because the current concentration upon application of a high voltage can be avoided by controlling the diffusion depth of the second p base region 6 to be smaller than that of the p$^+$ well region 5. Further, in the arrangement in which six first p base regions 4 and n source regions 7 in their surface layers are disposed around each of the second p base regions 6 and the n emitter region 8 in its surface layer, the first and second p base regions 4, 6 face each other over an increased length, which prevents current concentration.

Thus, according to the present invention, the RBSOA can be increased without reducing the ON-state voltage, regardless of the resistivity of the n base layer 3 and the current amplification factor of the pnp wide base transistor. In other words, the present invention is effective to reduce the ON-state voltage and increase the RBSOA, regardless of the rated voltage of the device and a method of producing a semiconductor crystal of the substrate of the device.

Eighth Embodiment

A 4500 V-class insulated gate thyristor was produced using an n-type silicon wafer having a resistivity of 200 $\Omega$·cm and a thickness of 600 $\mu$m, in the same manner in which the insulate gate thyristor of the first embodiment was produced. The thus produced thyristor was used as one example of the eighth embodiment of the invention.

The insulate gate thyristor of the present embodiment had the same diffusion depths of the respective regions as that of the first embodiment. Namely, the diffusion depth of the p$^+$ well region was 6 $\mu$m, and those of the first and second p base regions 4, 6 were 3 $\mu$m. The diffusion depths of the n emitter region 8 and n source region 7 were 1 $\mu$m and 0.3$\mu$m, respectively.

With regard to the width of the gate electrode 10, an experiment was conducted by setting the distance "Lg" between the first and second p base regions to 15 $\mu$m, and varying the spacing "Lgmin" as measured at the protrusion (s) of the second p base region 6 in a range of 3–15 $\mu$m.

Figure 14:
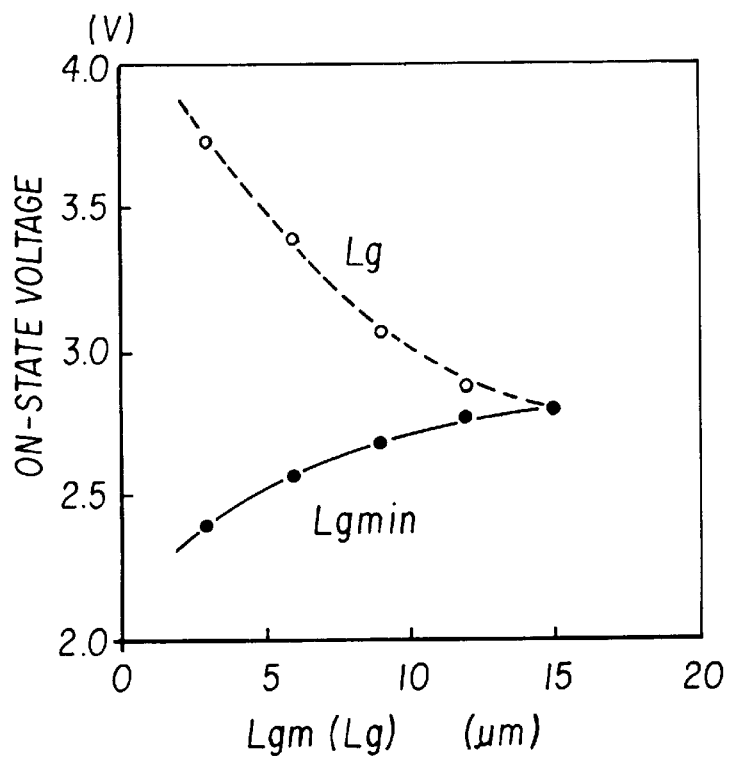
FIG. 14 is a graph showing the dependence of the ON-state voltage on Lgmin in an insulated gate thyristor of the eighth embodiment.

The graph of FIG. 14 shows the dependence of the ON-state voltage on Lgmin when the current density was 15 A/cm$^2$. The lifetime of carriers was controlled so as to provide a constant turn-off loss.

In the sixth embodiment, too, the ON-state voltage was reduced with a decrease in Lgmin, and reduced down to 1.50 V when Lgmin was 3 $\mu$m. The saturation current measured when Lgmin was in the range of 6–15 $\mu$m was constantly 100 A/cm$^2$, and did not vary in this range. The current was not saturated in the insulated gate thyristor in which Lgmin was 3 $\mu$m. The reasons of these results are the same as those as stated in the first embodiment.

The graph of FIG. 14 also indicates the dependence of the ON-state voltage on varying Lg in a comparative example in which the second p base regions 6 and n emitter regions 8 had no protrusions in the planar pattern of the diffusion regions on the silicon substrate as shown in FIG. 5. In this case, the ON-state voltage was increased as Lg was reduced. The saturation current measured when Lgmin was in the range of 6–15 $\mu$m was constantly 100 A/cm$^2$, and did not vary in this range, while the current was not saturated when Lgmin was 3 $\mu$m.

It will be understood from the graph of FIG. 14 that the insulated gate thyristor having a sufficiently low ON-state voltage can be provided by reducing Lgmin while keeping Lg at a certain large value, rather than simply reducing Lg.

Ninth Embodiment

Figure 19:
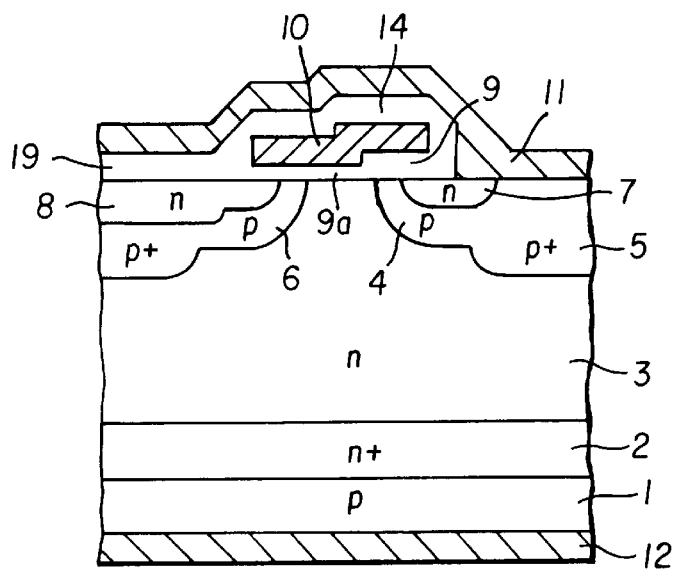
FIG. 19 is a cross sectional view of a part of an insulated gate thyristor of the ninth embodiment.

FIG. 19 is a cross sectional view of a part of an insulate gate thyristor according to the ninth embodiment of the present invention. This thyristor has the planar pattern of hexagonal arrangement of FIG. 4, to distinguish its effects. This embodiment is different from the first embodiment shown in FIG. 2(b) in that the thickness of the gate oxide film 9 varies from portion to portion. In FIG. 19, the gate oxide film 9 located above the first p base region 4 has the same thickness (equal to 0.07 $\mu$m) as that of the first embodiment of FIG. 2, while the gate oxide film 9a located above the second p base region 6 and n base layer 3 has a reduced thickness (equal to 0.05 $\mu$m).

In the insulated gate thyristor of the ninth embodiment, the resistance of the inversion layer appearing in the surface layer of the second p base region 6 and the resistance of the accumulation layer appearing in the surface layer of the n base layer 3 are reduced, and therefore more electrons are supplied from the n source region 7 to the n emitter region 8, resulting in an increased number of electrons injected from the n emitter region 8, and a reduced ON-state voltage.

Five types of 600 V-class devices, i.e., the insulated gate thyristor of the ninth embodiment having the structure of FIG. 19 and the pattern of FIG. 4, EST-1, EST-2, EST-3 and IGBT were produced as specimens, using epitaxial wafers. The width of the n source region 7 was 4 $\mu$m, and the width of the n emitter region 8 of EST-2 and EST-3 was 20 $\mu$m. All of these five devices had a chip size of 1 cm$^2$. The ON-state voltage, as defined by a fall of the potential occurring upon conduction of current of 100 A/cm$^2$, was 0.8 V for the insulated gate thyristor of the ninth embodiment, 1.6 V for the EST-1, 1.7 V for the EST-2, 1.0 V for the EST-3, and 2.3 V for the IGBT.

Figure 20:
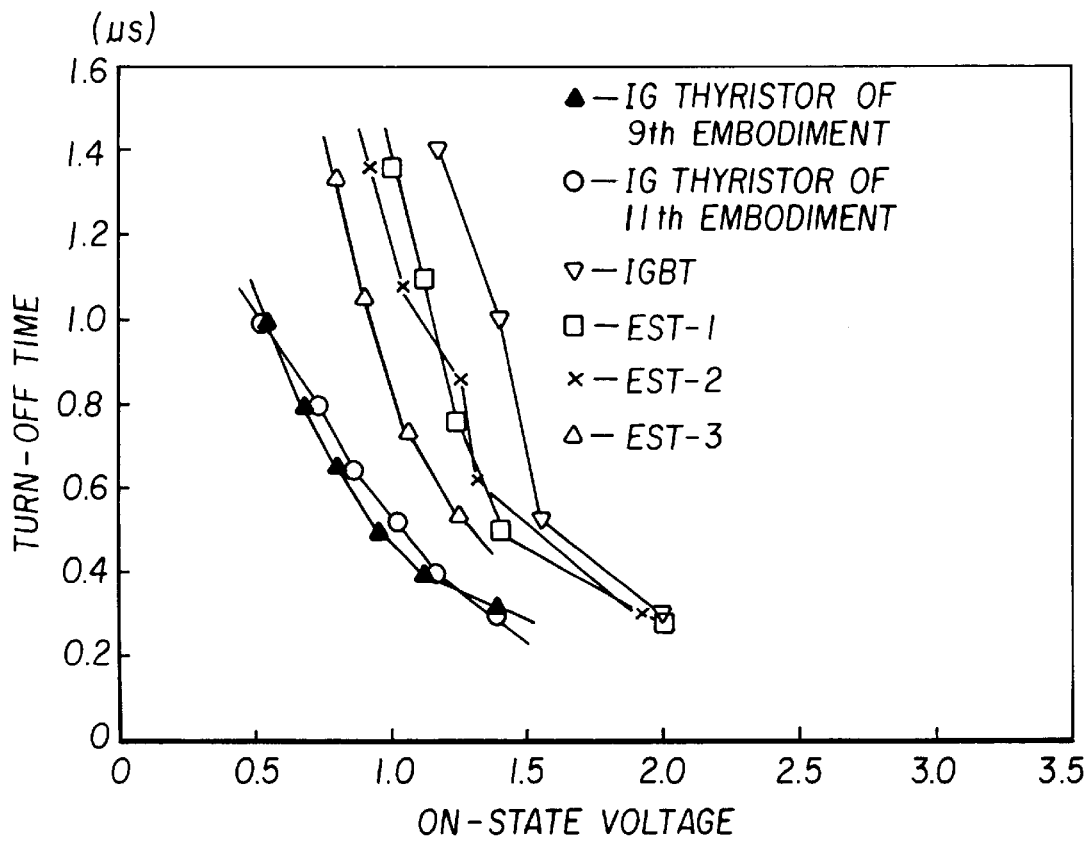
FIG. 20 is a graph showing trade-off characteristics between the ON-state voltage and the turn-off time of 600 V-class devices of the ninth and eleventh embodiments and comparative examples.

The graph of FIG. 20 shows trade-off characteristics between the ON-state voltage and the turn-off time of the above five types of devices. The axis of abscissas indicates the ON-state voltage as defined by a fall of the potential occurring upon conduction of current of 100 A/cm$^2$ at 25° C., and the axis of ordinates indicates the turn-off time measured at 125°. It will be understood from FIG. 20 that the device of the ninth embodiment shows a better trade-off characteristics than the ESTs and IGBT.

Tenth Embodiment

Figure 21:
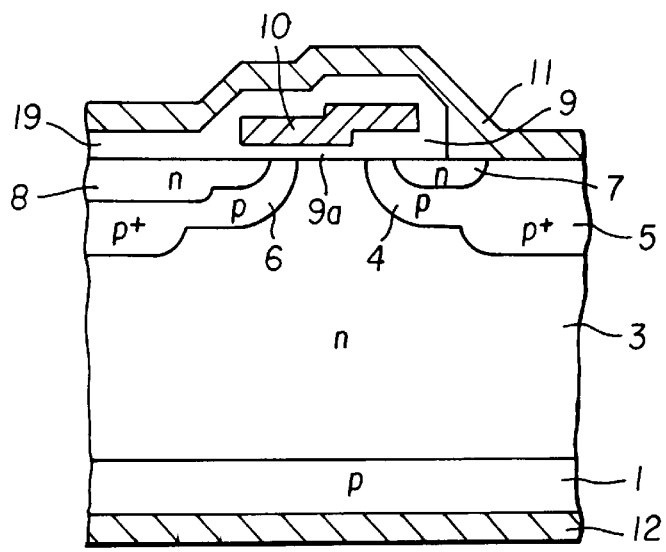
FIG. 21 is a cross sectional view of a part of an insulated gate thyristor of the tenth embodiment.

FIG. 21 is a cross sectional view of a part of an insulated gate thyristor according to the tenth embodiment of the present invention. The present embodiment is different from the ninth embodiment of FIG. 19 in that a bulk wafer having a resistivity of 150 Ω·cm and a thickness of 440 μm was used, rather than an epitaxial wafer. As in the ninth embodiment, the thickness of the gate oxide wafer 9 varies from portion to portion.

Five types of 2500 V-class devices, i.e., the insulated gate thyristor of the tenth embodiment having the structure of FIG. 21 and the pattern of FIG. 4, EST-1, EST-2, EST-3 and IGBT were produced as specimens, using bulk silicon wafers as used in the 2500 V-class devices as described above. The width of the n source region 7 was 4 μm, and the width of the n emitter region 8 of EST-2 and EST-3 was 20 μm. All of these five devices had a chip size of 1 cm². The ON-state voltage, as defined by a fall of the potential occurring upon conduction of current of 25 A/cm² at 25° C., was 1.1 V for the insulated gate thyristor of the tenth embodiment, 2.0 V for the EST-1, 2.2 V for the EST-2, 1.4 V for the EST-3, and 3.3 V for the IGBT.

Figure 22:
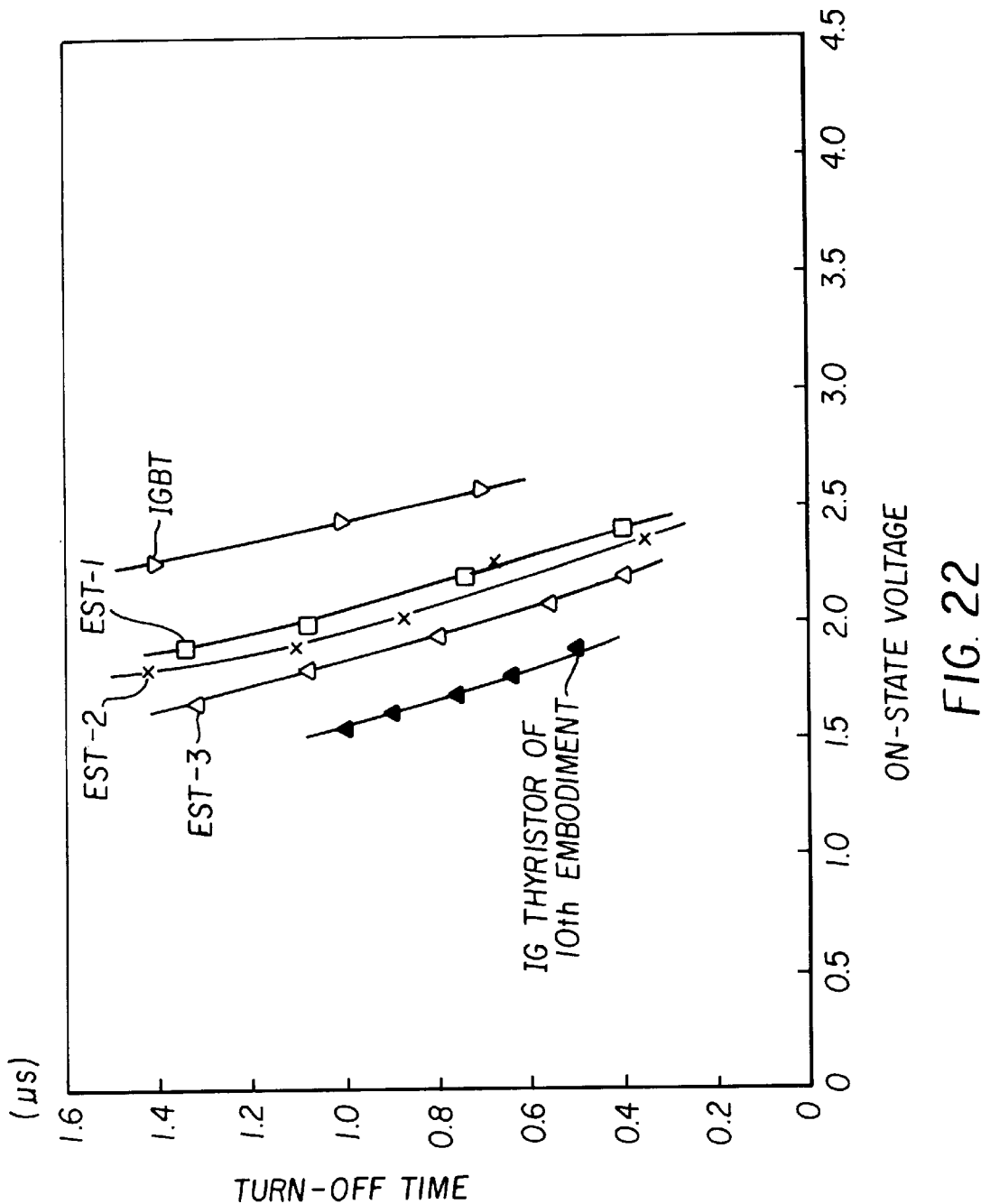
FIG. 22 is a graph showing trade-off characteristics between the ON-state voltage and the turn-off time of 2500 V-class devices of the tenth embodiment and comparative examples.

The graph of FIG. 22 shows trade-off characteristics between the ON-state voltage and the turn-off time of the above five types of devices. The axis of abscissas indicates the ON-state voltage, and the axis of ordinates indicates the turn-off time measured at 125°. It will be understood from FIG. 22 that the device of the tenth embodiment shows a better trade-off characteristics than the ESTs and IGBT. Thus, the high-voltage insulated gate thyristor using a bulk silicon wafer yields a similar effect to that using an epitaxial wafer.

Eleventh Embodiment

Figure 23:
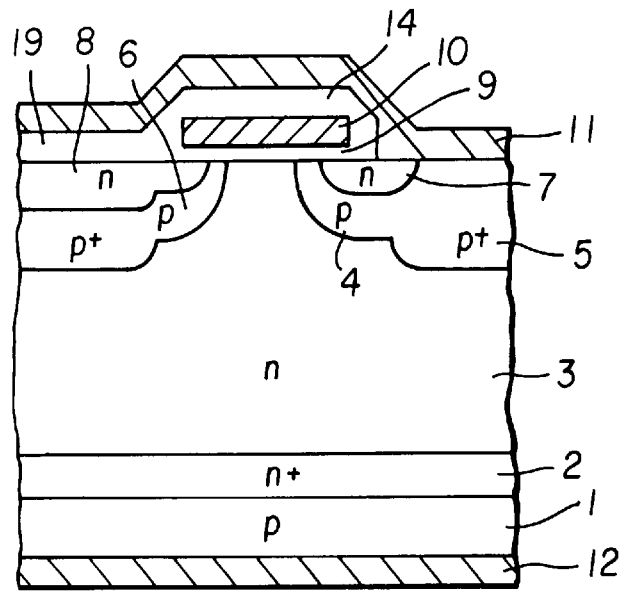
FIG. 23 is a cross sectional view of a part of an insulated gate thyristor of the eleventh embodiment.

FIG. 23 is a cross sectional view of a part of an insulated gate thyristor according to the eleventh embodiment of the present invention. This thyristor has the planar pattern of hexagonal arrangement of FIG. 4, to distinguish its effects. The present embodiment is different from the first embodiment shown in FIG. 2(b) in that the width of the exposed portion of the second p base region 6 that is interposed between the n base layer 3 and the n emitter region 8 is made smaller than the width of the exposed portion of the first p base region 4 that is interposed between the n base layer 3 and the n source region 7. More specifically, the width of the exposed portion of the first p base region 4 is about 2 μm, whereas the width of the exposed portion of the second p base region 6 is about 1 μm.

In the insulated gate thyristor of the eleventh embodiment, the resistance of the inversion layer appearing in the surface layer of the second p base region 6 is reduced, and therefore more electrons are supplied from the n source region 7 to the n emitter region 8, resulting in an increased number of electrons injected from the n emitter region 8, and a reduced ON-state voltage.

A specimen of the insulated gate thyristor of the eleventh embodiment having the structure of FIG. 23 and the pattern of FIG. 4 was produced, using an epitaxial wafer as in the 600 V-class device as described above. The width of the n source region 7 was 4 μm, and the chip size was 1 cm². The ON-state voltage, as defined by a fall of the potential occurring upon conduction of current of 100 A/cm² at 25° C., was 0.9 V.

The graph of FIG. 20 also shows a trade-off characteristic between the ON-state voltage and the turn-off time of the insulated gate thyristor of the eleventh embodiment. The turn-off time was measure at 125° C. It will be understood from FIG. 20 that the device of the eleventh embodiment exhibits a better trade-off characteristics than ESTs and IGBT.

Twelfth Embodiment

Figure 24:
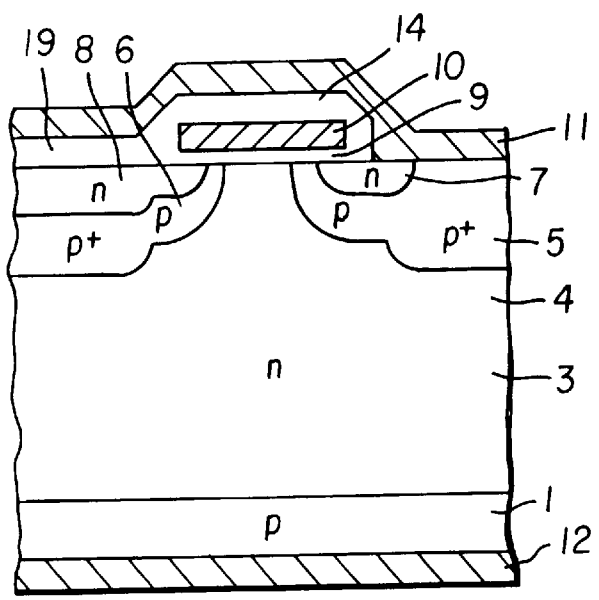
FIG. 24 is a cross sectional view of a part of an insulated gate thyristor of the twelfth embodiment.

FIG. 24 is a cross sectional view of a part of an insulated gate thyristor according to the twelfth embodiment of the present invention. This embodiment is different from the eleventh embodiment of FIG. 11 in that a bulk wafer having a resistivity of 150 Ω·cm and a thickness of 440 μm is used instead of an epitaxial wafer. As in the eleventh embodiment, the width of the exposed portion of the second p base region 6 that is interposed between the n base layer 3 and the n emitter region 8 is made smaller than the width of the exposed portion of the first p base region 4 that is interposed between the n base layer 3 and the n source region 7.

A specimen of the insulated gate thyristor of the twelfth embodiment having the structure of FIG. 24 and the pattern of FIG. 4 was produced, using a bulk wafer as in the 2500 V-class device as described above. The width of the n source region 7 was 4 μm, and the chip size was 1 cm². The ON-state voltage, as defined by a fall of the potential occurring upon conduction of current of 25 A/cm² at 25° C., was 1.1V.

The insulated gate thyristor of the twelfth embodiment has substantially the same trade-off characteristic between the ON-state voltage and the turn-off time as the insulated gate thyristor of the tenth embodiment, and shows a better trade-off characteristic than ESTs and IGBT. Thus, the high voltage insulated gate thyristor using such a bulk silicon wafer yields a similar effect to that using an epitaxial wafer.

Some features of the devices of the present invention as described above may be combined together to yield respective effects of the features, so as to provide an insulated gate thyristor having excellent characteristics.

The conventional EST is switched from the IGBT mode to the thyristor mode in which the thyristor is latched up, using a fall of the potential obtained by the current flowing in the Z direction. According to the present invention, on the other hand, the surface of the second second-conductivity-type base layer is covered with the insulating film, and a rise in the potential of the second second-conductivity-type base layer due to the hole current is utilized to switch the device to the thyristor mode, and uniformly resume the pn junction upon turn-off, whereby the controllable current is increased. Further, the first-conductivity-type base layer includes a locally narrowed portion interposed between the first and second second-conductivity-type base regions, whereby an effective channel length can be reduced, and the contact-type FET effect can be restricted, resulting in a lowered ON-state voltage.

In one preferred form of the invention, the thickness of the gate insulating film on the second second-conducitivity-type base region and first-conductivity-type base layer is made smaller than that of the gate insulating film on the first second-conductivity-type base region. In another preferred form of the invention, the width of the exposed position of the second second-conductivity-type base region interposed between the first-conductivity-type base layer and the first-conductivity-type emitter region is made smaller or narrower than that of the exposed portion of the first second-conductivity-type base region interposed between the first-conductivity-type base layer and the first-conductivity-type source region. In these arrangements, the resistance of the inversion layer appearing in the surface of the second second-conductivity-type base region and that of the accumulation layer appearing in the surface layer of the first-conductivity-type base layer upon application of a voltage to the gate electrode can be reduced, with a result of reduction in the ON-state voltage.

Thus, the present invention provides a voltage-driven-type insulated gate thyristor having a better trade-off characteristic between the ON-state voltage and the turn-off time and a larger reverse bias safe operation region than the conventional EST and IGBT, over a wide withstand-voltage range of 600 V to 2500 V.

The present invention not only improves the characteristics of the device itself, but also greatly contributes to reduction of switching losses in a power switching apparatus using these devices.

What is claimed is:

1. An insulated gate thyristor comprising;
   a first-conductivity-type base layer having a high resistivity;
   first and second second-conductivity-type base regions formed in selected areas of a surface layer of a first major surface of said first-conductivity-type base layer;
   a first second-conductivity-type well region formed under said first second-conductivity-type base region to be connected thereto;
   a first-conductivity-type source region formed in a selected area of a surface layer of said first second-conductivity-type base region;
   a first-conductivity-type emitter region formed in a selected area of a surface layer of said second second-conductivity-type base region;
   a gate electrode layer formed on a gate insulating film over a surface of said first second-conductivity-type base region, an exposed portion of said first-conductivity-type base layer, and a surface of said second second-conductivity-type base region, which surfaces and exposed portion are interposed between said first-conductivity-type source region and said first-conductivity-type emitter region;
   a first main electrode that contacts both an exposed portion of said first second-conductivity-type base layer and said first-conductivity-type source region;
   a second-conductivity-type emitter layer formed on a second major surface of said first-conductivity-type base layer;
   a second main electrode that contacts said second-conductivity-type emitter layer;
   a gate electrode that contacts said gate electrode layer; and
   an insulating film covering entire areas of surfaces of said second second-conductivity-type base region and said first-conductivity-type emitter region,
   wherein said first-conductivity-type base layer includes a locally narrowed portion which is interposed between said first and second second-conductivity-type base regions.

2. An insulated gate thyristor comprising:
   a first-conductivity-type base layer having a high resistivity;
   first and second second-conductivity-type base regions formed in selected areas of a surface layer of a first major surface of said first-conductivity-type base layer;
   a first second-conductivity-type well region formed under said first second-conductivity-type base region to be connected thereto;
   a first-conductivity-type source region formed in a selected area of a surface layer of said first second-conductivity-type base region;
   a first-conductivity-type emitter region formed in a selected area of a surface layer of said second second-conductivity-type base region;
   a gate electrode layer formed on a gate insulating film over a surface of said first second-conductivity-type base region, an exposed portion of said first-conductivity-type base layer, and a surface of said second second-conductivity-type base region, which surfaces and exposed portion are interposed between said first-conductivity-type source region and said first-conductivity-type emitter region;
   a first main electrode that contacts both an exposed portion of said first second-conductivity-type base layer and said first-conductivity-type source region;
   a second-conductivity-type emitter layer formed on a second major surface of said first-conductivity-type base layer;
   a second main electrode that contacts said second-conductivity-type emitter layer;
   a gate electrode that contacts said gate electrode layer; and
   an insulating film covering entire areas of surfaces of said second second-conductivity-type base region and said first-conductivity-type emitter region,
   wherein said gate insulating film includes a first portion located on said second second-conductivity-type base region and said first-conductivity-type base layer, and a second portion located on said first second-conductivity-type base region, said first portion having a smaller thickness than said second portion.

3. An insulated gate thyristor comprising;
   a first-conductivity-type base layer having a high resistivity;
   first and second second-conductivity-type base regions formed in selected areas of a surface layer of a first major surface of said first-conductivity-type base layer;
   a first second-conductivity-type well region formed under said first second-conductivity-type base region to be connected thereto;
   a first-conductivity-type source region formed in a selected area of a surface layer of said first second-conductivity-type base region;
   a first-conductivity-type emitter region formed in a selected area of a surface layer of said second second-conductivity-type base region;
   a gate electrode layer formed on a gate insulating film over a surface of said first second-conductivity-type base region, an exposed portion of said first-conductivity-type base layer, and a surface of said second second-conductivity-type base region, which surfaces and exposed portion are interposed between said first-conductivity-type source region and said first-conductivity-type emitter region;
   a first main electrode that contacts both an exposed portion of said first second-conductivity-type base layer and said first-conductivity-type source region;
   a second-conductivity-type emitter layer formed on a second major surface of said first-conductivity-type base layer;
   a second main electrode that contacts said second-conductivity-type emitter layer;
   a gate electrode that contacts said gate electrode layer; and
   an insulating film covering entire areas of surfaces of said second second-conductivity-type base region and said first-conductivity-type emitter region,
   wherein said second second-conductivity-type base region includes an exposed portion interposed between said first-conductivity-type base layer and said firstconductivity-type emitter region and having a first width, and said first second-conductivity-type base region includes an exposed portion interposed between said first-conductivity-type base layer and said first-conductivity-type source region and having a second width that is greater than said first width.

4. An insulated gate thyristor as defined in claim 3, wherein said first-conductivity-type base layer includes a locally narrowed portion which is interposed between said first and second second-conductivity-type base regions.

5. An insulated gate thyristor as defined in claim 1 or 3, wherein said gate insulating film includes a first portion located on said second second-conductivity-type base region and said first-conductivity-type base layer, and a second portion located on said first second-conductivity-type base region, said first portion having a smaller thickness than said second portion.

6. An insulated gate thyristor as defined in claim 1, wherein said second second-conductivity-type base region includes an exposed portion interposed between said first-conductivity-type base layer and said first-conductivity-type emitter region and having a first width, and said first second-conductivity-type base region includes an exposed portion interposed between said first-conductivity-type base layer and said first-conductivity-type source region and having a second width that is greater than said first width.

7. An insulated gate thyristor as defined in any one of claims 1 and 3–6, wherein at least one of said first and second second-conductivity-type base regions, said first-conductivity-type emitter region and said first-conductivity-type source region has a shape selected from a polygonal shape, a circular shape, and an elliptical shape.

8. An insulated gate thyristor as defined in any one of claims 1 and 3–6, wherein said first second-conductivity-type base region and said first-conductivity-type source region formed in the surface layer thereof are formed so as to surround said second second-conductivity-type base region.

9. An insulated gate thyristor as defined in any one of claims 1 and 3–6, wherein a plurality of said first second-conductivity-type base regions and a plurality of said first-conductivity-type source regions formed in surface layers thereof are formed around said second second-conductivity-type base region.

10. An insulated gate thyristor as defined in claim 9, wherein each of said first and second second-conductivity-type base regions, said first-conductivity-type emitter region, and said first-conductivity-type source regions has a polygonal shape, and each apex of said second second-conductivity-type base region and said first-conductivity-type emitter region faces one side of a corresponding one of said first second-conductivity-type base regions and one side of a corresponding one of said first-conductivity-type source regions.

11. An insulated gate thyristor as defined in claim 9, wherein said gate electrode layer is formed in a substantially annular shape so as to surround said gate insulating film on said second second-conductivity-type base region, and said first main electrode is disposed on the opposite side of said gate electrode layer, with an insulating film formed between the first main electrode and the gate electrode layer.

12. An insulated gate thyristor as defined in claim 11, wherein a contact portion between said first main electrode and said first second-conductivity-type base region and first-conductivity-type source region has a shape selected from a polygonal shape, a circular shape and an elliptical shape.

13. An insulated gate thyristor as define in claim 12, wherein said first-conductivity-type emitter region has a diffusion depth that is greater than that of said first-conductivity-type source region.

14. An insulated gate thyristor as defined in claim 13, further comprising a second second-conductivity-type well region formed under said second second-conductivity-type base region to be connected thereto, said second second-conductivity-type well region having the same diffusion depth as said first second-conductivity-type well region.

15. An insulated gate thyristor as defined in claim 14, wherein lifetime killers are present in local portions of the thyristor.

16. An insulated gate thyristor as defined in claim 2, wherein said first-conductivity-type base layer includes a locally narrowed portion which is interposed between said first and second second-conductivity-type base regions.

17. An insulated gate thyristor as defined in claim 2, wherein said second second-conductivity-type base region includes an exposed portion interposed between said first-conductivity-type base layer and said first-conductivity-type emitter region and having a first width, and said first second-conductivity-type base region includes an exposed portion interposed between said first-conductivity-type base layer and said first-conductivity-type source region and having a second width that is greater than said first width.

18. An insulated gate thyristor as defined in claim 2, wherein at least one of said first and second second-conductivity-type base regions, said first-conductivity-type emitter region and said first-conductivity-type source region has a shape selected from a polygonal shape, a circular shape, and an elliptical shape.

19. An insulated gate thyristor as defined in claim 2, wherein said first second-conductivity-type base region and said first-conductivity-type source region formed in the surface layer thereof are formed so as to surround said second second-conductivity-type base region.

20. An insulated gate thyristor as defined in claim 2, wherein a plurality of said first second-conductivity-type base regions and a plurality of said first-conductivity-type source regions formed in surface layers thereof are formed around said second second-conductivity-type base region.

21. An insulated gate thyristor as defined in claim 20, wherein each of said first and second second-conductivity-type base regions, said first-conductivity-type emitter region, and said first-conductivity-type source regions has a polygonal shape, and each apex of said second second-conductivity-type base region and said first-conductivity-type emitter region faces one side of a corresponding one of said first second-conductivity-type base regions and one side of a corresponding one of said first-conductivity-type source regions.

22. An insulated gate thyristor as defined in claim 20, wherein said gate electrode layer is formed in a substantially annular shape so as to surround said gate insulating film on said second second-conductivity-type base region, and said first main electrode is disposed on the opposite side of said gate electrode layer, with an insulating film formed between the first main electrode and the gate electrode layer.

23. An insulated gate thyristor as defined in claim 22, wherein a contact portion between said first main electrode and said first second-conductivity-type base region and first-conductivity-type source region has a shape selected from a polygonal shape, a circular shape and an elliptical shape.

24. An insulated gate thyristor as define in claim 23, wherein said first-conductivity-type emitter region has a diffusion depth that is greater than that of said first-conductivity-type source region.

* * * * *